US006673659B2

(12) United States Patent
Sakama et al.

(10) Patent No.: US 6,673,659 B2
(45) Date of Patent: Jan. 6, 2004

(54) SEMICONDUCTOR DEVICE AND METHOD OF PRODUCING THE SAME

(75) Inventors: Mitsunori Sakama, Kanagawa (JP); Noriko Ishimaru, Kanagawa (JP); Masahiko Miwa, Nara (JP); Michinori Iwai, Nara (JP)

(73) Assignees: Semiconductor Energy Laboratory Co., Ltd., Kanagawa-ken (JP); Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/771,625

(22) Filed: Jan. 30, 2001

(65) Prior Publication Data

US 2001/0011725 A1 Aug. 9, 2001

(30) Foreign Application Priority Data

Jan. 31, 2000 (JP) .......................... 2000-022022

(51) Int. Cl.[7] .................. H01L 21/00; H01L 21/20; H01L 27/01; H01L 27/12; H01L 31/0392
(52) U.S. Cl. ................... 438/149; 438/150; 438/166; 438/486; 257/347
(58) Field of Search ................... 438/150, 166, 438/486, 149; 257/347

(56) References Cited

U.S. PATENT DOCUMENTS

| 5,643,826 | A | 7/1997 | Ohtani et al. |
| 5,923,962 | A | 7/1999 | Ohtani et al. |
| 6,338,990 | B1 | 1/2002 | Yanai et al. |
| 6,380,046 | B1 | 4/2002 | Yamazaki |
| 6,461,899 | B1 | 10/2002 | Kitakado et al. |
| 6,475,845 | B2 | 11/2002 | Kimura |
| 2001/0004121 | A1 | 6/2001 | Sakama et al. |

FOREIGN PATENT DOCUMENTS

| JP | 07-130652 | 5/1995 |
| JP | 08-078329 | 3/1996 |
| JP | 10-135468 | 5/1998 |
| JP | 10-135469 | 5/1998 |

OTHER PUBLICATIONS

Coluzza et al., "Silicon Oxynitride and Silicon Oxynitride–Silicon Interface: A Photoemission Study," IEEE 1989, pp. 2821–2824.

M. Modreanu et al., "Physical–Optical Properties of LPCVD Amorphous Silicon Rich–Nitride and Oxynitride," IEEE 1998, pp. 201–204.

Bona et al., Versatile Silicon–Oxynitride Planer Lightwave Circuits for Interconnect Applications, IEEE 1999, pp 145–148.

Primary Examiner—Steven Loke
(74) Attorney, Agent, or Firm—Eric J. Robinson; Robinson Intellectual Property Law Office, P.C.

(57) ABSTRACT

A base film is formed for the TFTs in order to prevent diffusion of impurities from the glass substrate into the active layer, to maintain stability in the characteristics such as Vth and S-value of the TFTs and to maintain enhanced productivity. A film in which the composition ratios of N, O and H are continuously changed by changing the flow rates of $H_2$ and $N_2O$, is used as the base film to prevent a change in the TFT characteristics. The base film can be formed by varying the flow rates of $H_2$ and $N_2O$ in the same film-forming chamber to enhance the productivity.

32 Claims, 16 Drawing Sheets

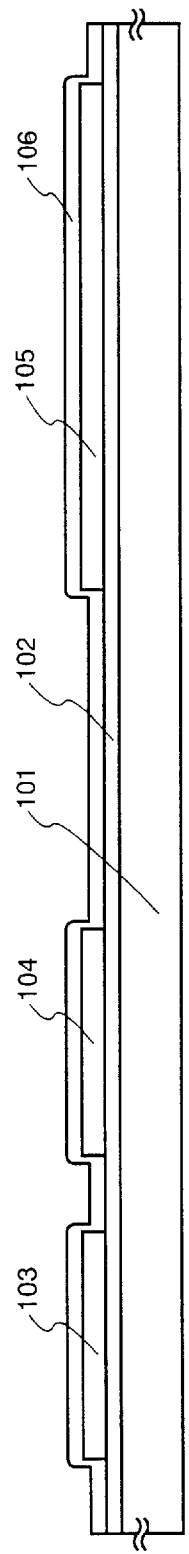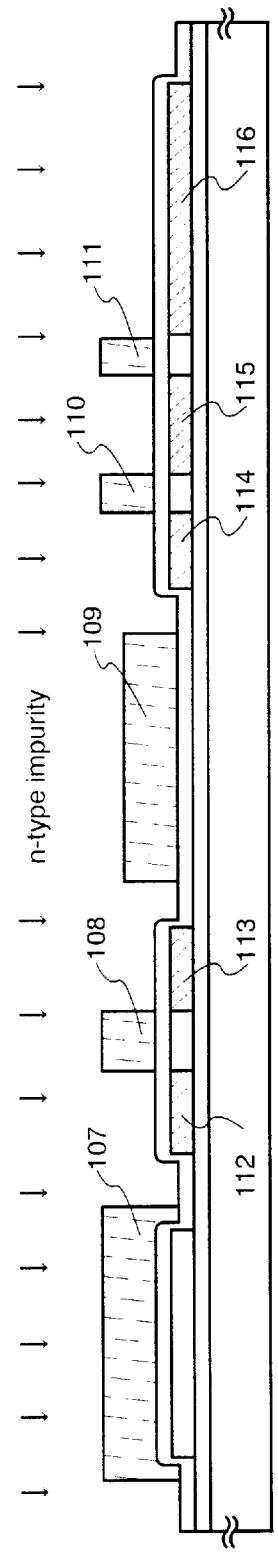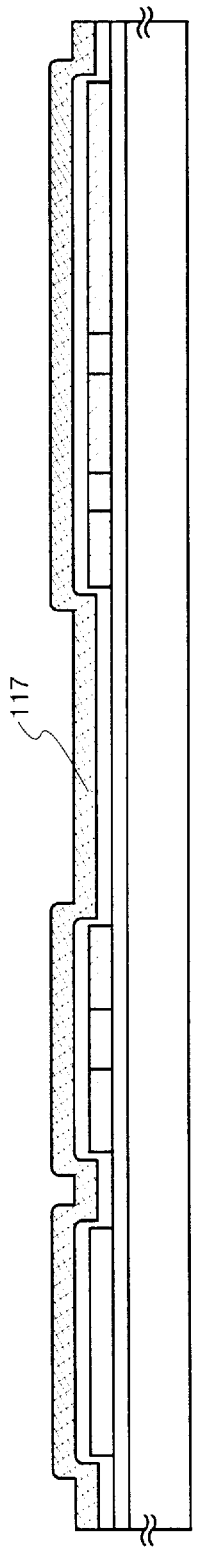

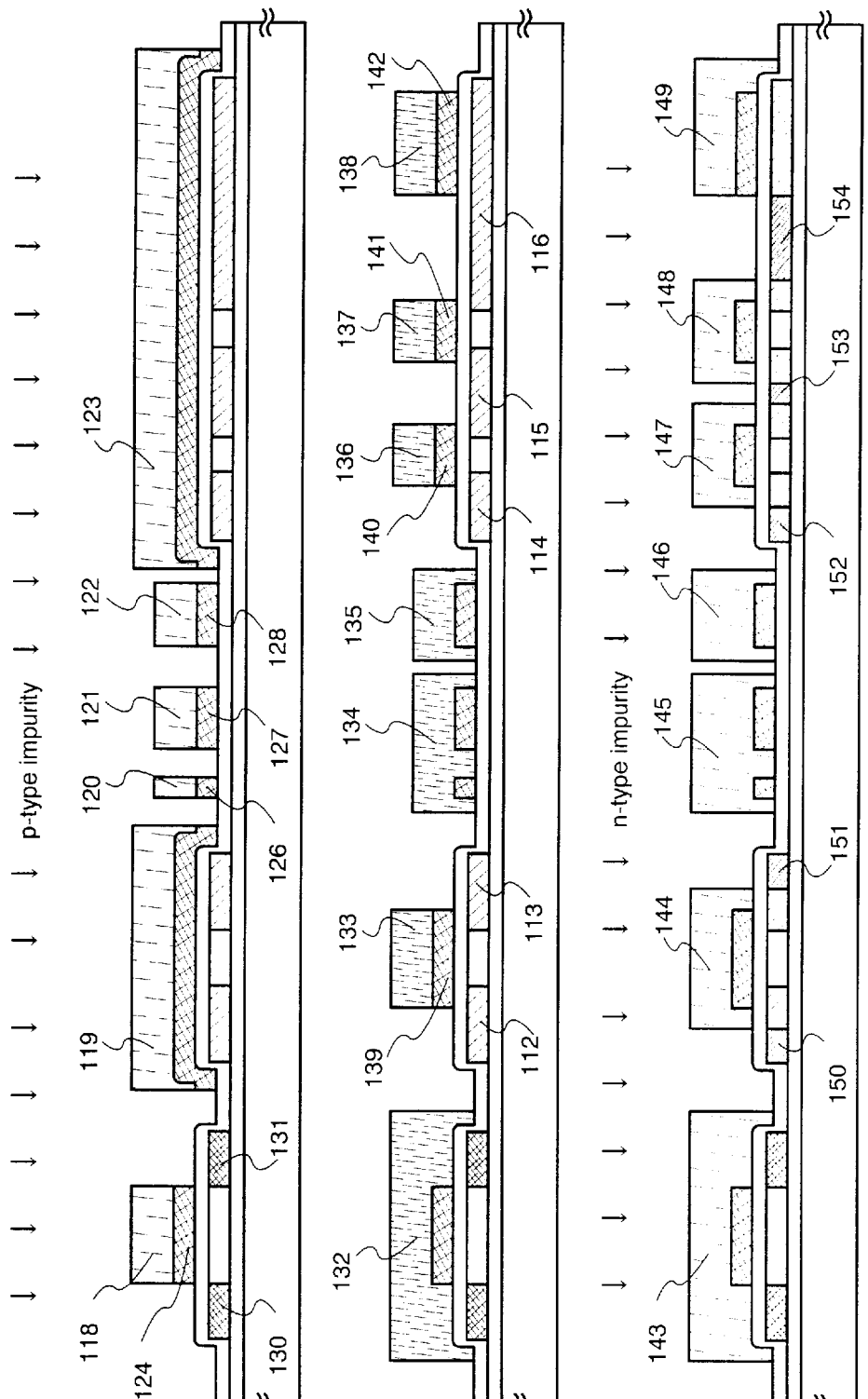

US 6,673,659 B2

SEMICONDUCTOR DEVICE AND METHOD OF PRODUCING THE SAME

BACKGROUND OF THE INVENTION

1. Field of the Invention

The present invention relates to a semiconductor device having a circuit constituted by thin-film transistors (hereinafter referred to as TFTs) and a method of producing the same. More specifically, the invention relates to an electro-optical device as represented by an active matrix-type liquid crystal display device having, for example, a pixel portion and a driver circuit formed on the same substrate, and to an electronic device mounting the above electro-optical device as a part.

In this specification, the semiconductor device stands for devices that work utilizing the semiconductor characteristics, in general. Electro-optical devices as represented by the active matrix-type liquid crystal display devices formed by using thin-film transistors, electronic devices mounting such electro-optical device as a part, and semiconductor circuits, are all semiconductor devices.

2. Prior Arts

There has been developed a thin-film transistor (TFT) by using a semiconductor thin film formed on an insulating substrate such as a glass. As a material of the semiconductor thin film, there can be used an amorphous silicon film or a crystalline silicon film formed by crystallizing the amorphous silicon film by a laser annealing method or a heat annealing method. Among them, the TFT using the polycrystalline silicon film as an active layer features a high current drivability owing to its high degree of electric field mobility, can be finely machined, and makes it possible to increase the numerical aperture in the pixel portion.

Such a TFT has been widely applied to electronic devices such as ICs and electro-optical devices, and is used, for example, as a pixel switching element or driver circuit in the active matrix-type display device. As the TFT substrate, there is typically used a glass substrate such as of barium borosilicate glass or alumino-borosilicate glass. The glass substrate has a heat resistance inferior to that of a quartz substrate, but offers such an advantage that the substrate of a large area can be easily and cheaply produced to cheaply realize a display device of a large screen.

The glass substrate such as barium borosilicate glass or alumino-borosilicate glass contains trace amounts of impurities such as alkali metal elements like sodium (Na), and the electric characteristics of the TFT vary as the impurity ions infiltrate into the active layer from the glass substrate. To prevent this variation in the electric characteristics, a base film (blocking layer) comprising a silicon oxide film, a silicon nitride film or a silicon oxynitride film has been formed on the surface of the glass substrate on where TFTs are formed.

It has been known that the TFT characteristics can be effectively stabilized if there is used, as a base film, a laminated film comprising a silicon nitride film on the side of the substrate and a silicon oxide film on the side of the active layer.

In the case of a top-gate TFT, the TFT characteristics are greatly affected by the quality of the base film since the channel-forming region is in contact with the base film.

When a voltage is applied to the gate electrode of TFT, an electric field is formed in the active layer and impurity ions in the glass substrate are pulled toward the side of the active layer. Depending upon the quality of the base film, therefore, the impurity ions infiltrate into the active layer or into the gate-insulating layer through the base film, and the electric characteristics of the TFTs undergo a change accompanying thereto to deteriorate the reliability.

A silicon nitride film as the base film exhibits a merit in that it exhibits a large effect for blocking impurity ions but has a defect in that it exhibits many large trap levels to affect the TFT characteristics. Besides, the silicon nitride film produces a large internal stress and causes a distortion on the interface relative to the active layer, resulting in the deterioration in the TFT characteristics such as negative shift of Vth (threshold voltage) and an increase in the S-value (subthreshold constant). Further, the silicon oxide film as the base film exhibits merits such as a wider band gap than that of the silicon nitride film, a high insulating property and a low trap level accompanied, however, by such defects as easy absorption of water and small effect for blocking impurity ions. The silicon oxynitride film exhibits properties that differ depending upon the nitrogen concentration and the oxygen concentration in the film. To enhance the effect for blocking impurity ions, therefore, the film must be formed dense by increasing the nitrogen concentration in the film. However, an increase in the nitrogen concentration in the silicon oxynitride film develops the same defect as that of the silicon nitride film.

Further, when a film containing large amounts of fixed electric charge is brought, as a base film, into contact with the active layer, a trap level is formed on the interface between the base film and the active layer causing the TFT characteristics to be deteriorated. In general, the fixed electric charge increases with an increase in the nitrogen concentration in the film.

When the silicon nitride film and the silicon oxide film are laminated one upon the other, special film-forming chambers are required since they are constituted by different elements. In this case, the temperature of the film-forming chambers drops since the substrate is cooled as it is being conveyed. Accordingly, preheating is required so as not to drop the temperature of the substrate. The preheating time accounts for an increase in the treating time.

SUMMARY OF THE INVENTION

The present invention is concerned with a technique for solving the above-mentioned problems, and provides a base film which helps stabilize TFT characteristics, improves reliability, and can be excellently produced, and a method of forming the same.

In order to solve the above-mentioned problems according to the present invention, a silicon oxynitride film is formed by a plasma CVD method by using $SiH_4$, $N_2O$ and $H_2$, and this film is used as a base film for a TFT. The properties of the silicon oxynitride film that is formed is controlled by, chiefly, varying the flow rates of $N_2O$ and $H_2$. The hydrogen concentration and the nitrogen concentration are increased in the film upon increasing the flow rate of $H_2$. Upon increasing the flow rate of $N_2O$, further, the hydrogen concentration and the nitrogen concentration decrease in the film, and the oxygen concentration increases. On the other hand, the silicon concentration does not almost change even if only a ratio of $N_2$ and $N_2O$ gas flows is changed. This makes it possible to form a silicon oxynitride film on the side of the substrate, the silicon oxynitride film having a composition exhibiting properties which are merits of the silicon nitride film, and to form a silicon oxynitride film on the side of the active layer, the silicon oxynitride film having a composition exhibiting properties which are merits of the silicon oxide film, while continuously changing the compositions thereof, thereby to form a base film of good quality picking up merits of both the silicon nitride film and the silicon oxide film. The silicon oxynitride films exhibiting the above-mentioned properties are formed by the same film-forming method by simply changing the gas flow rate ratios, and can be formed in the same film-forming chamber contributing to enhancing the productivity.

Concretely speaking, there are formed a silicon oxynitride film formed over $SiH_4$, $N_2O$ and $H_2$ flow rate ratios of Xh=0.5 to 5 (Xh=$H_2$/($SiH_4$+$N_2O$)), Xg=0.94 to 0.97 (Xg=$N_2O$/($SiH_4$+$N_2O$)), and a silicon oxynitride film formed over flow rate ratios of Xh=0 (Xh=$H_2$/($SiH_4$+$N_2O$)), Xg=0.97 to 0.99 (Xg=$N_2O$/($SiH_4$+$N_2O$)). these silicon oxynitride films being separately used.

In forming the silicon oxynitride film by the plasma CVD method, $H_2$ is added to a mixture gas of $SiH_4$ and $N_2O$ to prevent radicals formed by the decomposition of $SiH_4$ from being polymerized in the gaseous phase (in the reaction space) and to eliminate the formation of particles. On the surface on where the film grows, further, an excess of hydrogen is not taken in by the film, that is caused by the reaction of pulling hydrogen adsorbed on the surfaces by hydrogen radicals. This action is intimately related to the substrate temperature at the time when the film is deposited; i.e., the action is obtained by setting the substrate temperature to be from 300° C. to 400° C. and, preferably, 400° C. As a result, it is allowed to form a dense film having less defect density, and trace amounts of hydrogen in the film effectively works to relax the lattice strain. To highly densely generate hydrogen radicals by decomposing hydrogen, a glow discharge is generated at a high power-source frequency of 13.56 MHz to 120 MHz and, preferably, 27 MHz to 60 MHz, with a discharge power density of 0.1 W/cm$^2$ to 1 W/cm$^2$.

Upon employing the above preparation conditions, the silicon oxynitride film to which the invention is applied possesses a nitrogen concentration of from 0.5 atomic % to 10 atomic %, a hydrogen concentration of from 0.5 atomic % to 5 atomic % and an oxygen concentration of from 50 atomic % to 70 atomic %.

The feature of the invention resides in that in forming a base film of TFT by the silicon oxynitride films, the composition is differed in the base film depending on the side of the substrate and on the side of the active layer, and the nitrogen concentration and the hydrogen concentration in the film are set to be relatively higher and the oxygen concentration is set to be relatively lower for the former side.

For example, the first layer of the base film in contact with the substrate is formed of the silicon oxynitride film having a nitrogen concentration of 7 to 10 atomic %, a hydrogen concentration of 2 to 3 atomic % and an oxygen concentration of 52 to 55 atomic %, and the second layer in contact with the active layer is formed of the silicon oxynitride film having a nitrogen concentration of 1 to 2 atomic %, a hydrogen concentration of 0.5 to 2 atomic % and an oxygen concentration of 62 to 65 atomic % to form a step-like gradient of concentration. Or, there may not exist a clear distinction between the first layer and the second layer like the one described above but, instead, the composition may be continuously changed.

The silicon oxynitride film is formed by using a plasma device which is constituted by parallel flat plates of the capacitor-coupled type. It is also allowable to use the one of the induction coupled type or a plasma CVD device utilizing the energy of magnetic field such as of electron cyclotron resonance. The composition of the silicon oxynitride film is varied by using $SiH_4$ and $N_2O$ gases and by adding $H_2$ thereto. The plasma is formed under a pressure of 10 Pa to 133 Pa (desirably, 20 Pa to 40 Pa), with a high-frequency power density of 0.2 W/cm$^2$ to 1 W/cm$^2$ (preferably, 0.3 W/cm$^2$ to 0.5 W/cm$^2$), at a substrate temperature of 200° C. to 450° C. (preferably, 300° C. to 400° C.), and an oscillation frequency of high-frequency power source of 10 MHz to 120 MHz (preferably, 27 MHz to 60 MHz).

Table 1 shows three kinds of preparation conditions. The condition #210 is for forming the silicon oxynitride film from $SiH_4$ and $N_2O$. The conditions #211 and #212 are when $H_2$ is added to $SiH_4$ and $N_2O$, and in which the flow rate of $H_2$ being added is varied. In this specification, the silicon oxynitride film formed from $SiH_4$ and $N_2O$ is expressed as silicon oxynitride film (A), and the silicon oxynitride film formed from $SiH_4$, $N_2O$ and $H_2$ is expressed as silicon oxynitride film (B). The silicon oxynitride film (A) is formed with $SiH_4$, $N_2O$ and $H_2$ flow rate ratios of Xh=0 (Xh=$H_2$/($SiH_4$+$N_2O$)) and Xg=0.97 to 0.99 (Xg=$N_2O$/($SiH_4$+$N_2O$)), and the silicon oxynitride film (B) is formed with $SiH_4$, $N_2O$ and $H_2$ flow rate ratios of Xh=0.5 to 5 (Xh=$H_2$/($SiH_4$+$N_2O$)) and Xg=0.94 to 0.97 (Xg=$N_2O$/($SiH_4$+$N_2O$)).

Table 1 further shows pretreatment conditions executed prior to forming the silicon oxynitride film. The pretreatment is not absolutely necessary but is effective in enhancing the reproducibility of silicon oxynitride film properties or in enhancing the reproducibility of properties when the invention is applied to the TFTs.

TABLE 1

| Conditions/Sample No. | | | #210 | #211 | #212 |
|---|---|---|---|---|---|
| Plasma cleaning | Gases (sccm) | $H_2$ | 100 | 2 | 300 |
| | | $O_2$ | 100 | 0 | 0 |
| | Pressure (Pa) | | 20 | 20 | 20 |
| | High-frequency power (W/cm$^2$) | | 0.2 | 0.2 | 0.2 |
| | Processing time (minutes) | | 2 | 2 | 2 |
| Film formation | Gases (sccm) | $SiH_4$ | 4 | 5 | 5 |
| | | $N_2O$ | 400 | 120 | 120 |
| | | $H_2$ | 0 | 500 | 125 |
| | Pressure (Pa) | | 20 | 20 | 20 |
| | High-frequency power (W/cm$^2$) | | 0.4 | 0.4 | 0.4 |
| | Substrate temperature (° C.) | | 400 | 400 | 400 |

Referring to Table 1, the pretreatment conditions are such that the treatment is effected for 2 minutes by producing a plasma while introducing 200 SCCM of hydrogen, under a pressure of 20 Pa and with a high-frequency electric power of 0.2 W/cm$^2$. The pretreatment may further be conducted by producing a plasma in the same manner as above but introducing 100 SCCM of hydrogen and 100 SCCM of oxygen. Though not shown in Table, the pretreatment may be conducted for several minutes by introducing $N_2O$ and hydrogen under a pressure of 10 Pa to 70 Pa and with a high-frequency power density of 0.1 W/cm$^2$ to 0.5 W/cm$^2$. In the pretreatment, it is desired that the substrate is maintained at a temperature of 300° C. to 450° C. and, preferably, at 400° C. The pretreatment works to clean the to-be-deposited surface of the substrate and to stabilize the interfacial properties of the silicon oxynitride film that is deposited later by temporarily inactivating the to-be-deposited surface by the adsorption of hydrogen. The pretreatment further favorably works to lower the interfacial level density by oxidizing the to-be-deposited surface and the vicinities thereof by simultaneously introducing oxygen and $N_2O$.

Concretely speaking, the silicon oxynitride film (B) is formed under the condition #211 by introducing 5 SCCM of SiH$_4$, 120 SCCM of N$_2$O and 500 SCCM of hydrogen with a high-frequency power density of 0.4 W/cm$^2$ at a substrate temperature of 400° C. The high frequency of electric power source is 10 MHz to 120 MHz and, preferably, 27 MHz to 60 MHz, but is here set to be 60 MHz. Under the condition #212, the film is formed by introducing hydrogen at a flow rate of 125 SCCM in contrast with the condition #211. The flow rates of the gases are not to specify their absolute values, but a meaning resides in the flow rate ratios. When Xh=[H$_2$]/([SiH$_4$]+[N$_2$O]), then, Xh may be from 0.1 to 7. When Xg=[N$_2$O]/([SiH$_4$]+[N$_2$O]), then, Xg may be from 0.90 to 0.99. The silicon oxynitride (A) is formed under the condition #210.

Table 2 shows representative properties of the silicon oxynitride films obtained under the above conditions, as well as compositions and densities of hydrogen (H), nitrogen (N), oxygen (O) and silicon (Si) found from Rutherford Backscattering Spectrometry (hereinafter abbreviated as RBS, systems used: 3S-R10 accelerator, NEC 3SDH pelletron end station; CE & ARBS-400).

TABLE 2

| Sample No. | | #210 | #211 | #212 |
|---|---|---|---|---|
| Contents | H | 1.6 ± 0.5 | 3.0 ± 0.5 | 2.0 ± 0.5 |
| (atomic %) | N | 1.5 ± 4 | 9.6 ± 4 | 7.9 ± 4 |
| | O | 63.5 ± 2 | 53.8 ± 2 | 56.4 ± 2 |
| | Si | 33.4 ± 2 | 33.6 ± 2 | 33.7 ± 2 |
| Composition ratios | O/Si | 1.9 | 1.6 | 1.67 |
| | N/Si | 0.04 | 0.18 | 0.14 |
| Density (atoms/cm$^3$) | | 6.53 × 10$^{22}$ | 7.16 × 10$^{22}$ | 7.11 × 10$^{22}$ |

From the results of Table 2, the concentration of hydrogen in the film increases as H$_2$ is added during the formation of film. This also causes a change in the contents of oxygen and nitrogen. In the silicon oxynitride film (A), the ratio of O to Si is 1.9 (allowable range is 1.7 to 2), and the ratio of N to Si is 0.04 (allowable range is 0.02 to 0.06). On the other hand, the composition of the silicon oxynitride film (B) varies depending upon the flow rate of H$_2$ added during the formation of film, and in which the ratio of O to Si is 1.6 (allowable range is 1.4 to 1.8) and the ratio of N to Si is 0.14 to 0.18 (allowable range is 0.05 to 0.5), the ratio of O to Si being decreased and the ratio of N to Si being increased.

The density of the film increases with an increase in the content of nitrogen, i.e., increases from 6.5 atoms/cm$^3$ of the silicon oxynitride film (A) to 7.1 atoms/cm$^3$ of the silicon oxynitride film (B). It is considered that the film becomes dense with an increase in the content of nitrogen since the etching rate is 120 nm/min for the silicon oxynitride film (A) and 63 to 105 nm/min for the silicon oxynitride film (B) with a mixture solution (trade name: LAL500, manufactured by Sterachemifa Co.) containing 7.13% of ammonium hydrogenfluoride (NH$_4$HF$_2$) and 15.4% of ammonium fluoride (NH$_4$F) at 20° C. It can therefore be said that the film is becoming dense with an increase in the nitrogen content. This fact indicates that a dense and hard film efficiently blocks impurities from the substrate, and it is meaningful to provide the silicon oxynitride film (B) on the side of the substrate.

When compared in terms of the internal stress, the compressive stress of −4.26×10$^8$ Pa of the silicon oxynitride film (A) greatly changes to −7.29×106 Pa through the heat treatment (500° C. for one hour+550° C. for 4 hours, equivalent to the treating conditions in the step of crystallization). The silicon oxynitride film (B), on the other hand, has a tensile stress of 2.31×10$^8$ Pa, which does not almost change even through the heat treatment. The phenomenon of change in the internal stress due to the heat treatment can be considered to be related to a change in the structure or a change in the composition of the film, and it can be said that the silicon oxynitride film (B) has a better thermal stability.

In the foregoing were described typical properties of the silicon oxynitride film. The silicon oxynitride film which is an insulating film used in the present invention is in no way limited to those shown in Tables 1 and 2. The silicon oxynitride film (A) has a composition, i.e., the insulating film suited as a base film of the semiconductor device as represented by TFT, has a composition that contains 1 to 2 atomic % of nitrogen, 0.5 to 2 atomic % of hydrogen and 62 to 65 atomic % of oxygen. The silicon oxynitride film (B) has a composition that contains 7 to 10 atomic % of nitrogen, 2 to 3 atomic % of hydrogen and 52 to 55 atomic % of oxygen. Further, the silicon oxynitride film (A) has a density of not smaller than 6×10$^{22}$ but smaller than 7×10$^{22}$ atoms/cm$^3$ and the silicon oxynitride film (B) has a density of not smaller than 7×10$^{22}$ but smaller than 8×10$^{22}$ atoms/cm$^3$. The etching rate with a mixture solution containing the above ammonium hydrogenfluoride (NH$_4$HF$_2$) and ammonium fluoride (NH$_4$F) is 110 to 130 nm/min for the silicon oxynitride film (A) and 60 to 110 nm/min for the silicon oxynitride film (B).

BRIEF DESCRIPTION OF THE DRAWINGS

FIGS. 4A to 4C are views illustrating steps for forming AM-LCD (embodiment 2);

FIGS. 5A to 5C are views illustrating steps for forming AM-LCD (embodiment 2);

DESCRIPTION OF THE PREFERRED EMBODIMENTS

Described below is a method of forming a base film adapted to a semiconductor device as represented by TFT according to an embodiment.

Figure 1A:
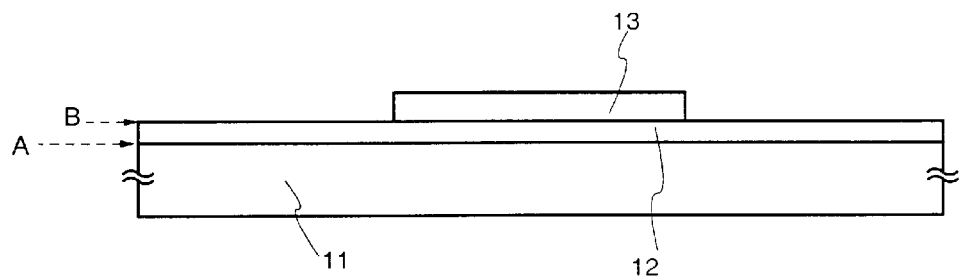
FIGS. 1A to 1C are views illustrating the constitution of a base film according to the invention.

Described below is an example of applying a silicon oxynitride film (A) and a silicon oxynitride film (B) as a base film of a TFT. FIG. 1A illustrates the constitution of a top gate-type TFT. On a substrate 11 is formed a base film (or also called blocking layer) 12, and an island-like semiconductor layer 13 is formed thereon. The island-like semiconductor layer may be either an amorphous semiconductor material or a crystalline semiconductor material. The base film 12 is formed in contact with the lower surface of the island-like semiconductor layer 13.

Figure 1B:
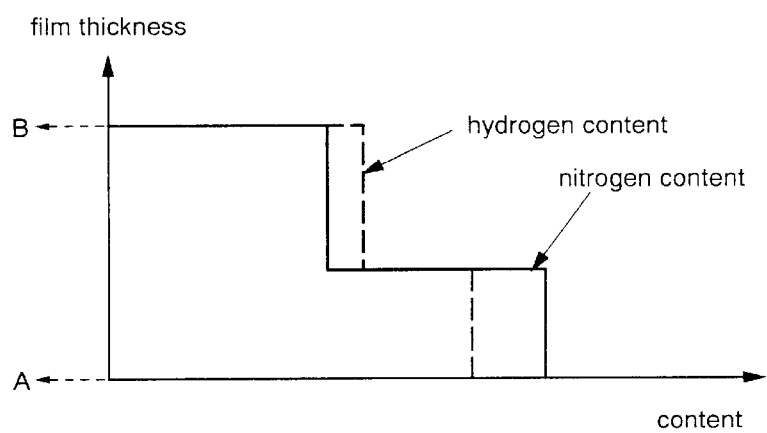
Figure 1C:
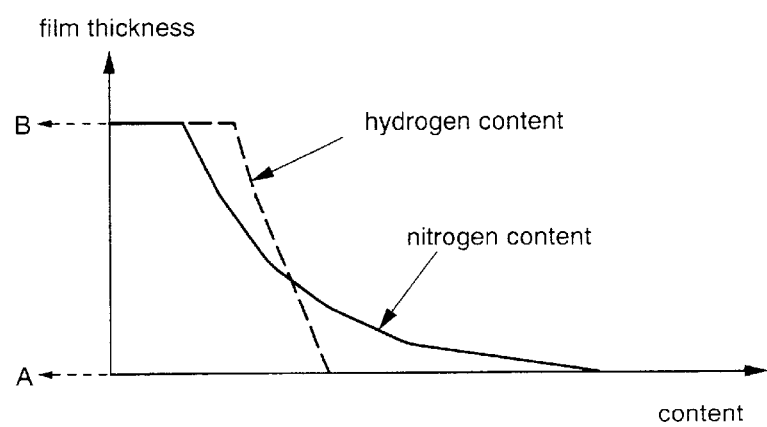

The base film 12 is so constituted that the composition changes continuously or stepwise from the silicon oxynitride film (A) toward the silicon oxynitride film (B). FIGS. 1B and 1C are graphs illustrating compositions of hydrogen and nitrogen in the silicon oxynitride film. The constitution may be such that, as shown in FIG. 1B, the silicon oxynitride film (B) is formed in contact with the island-like semiconductor layer and the silicon oxynitride film (A) is formed thereon or such that, as shown in FIG. 1C, the composition is continuously changed from the silicon oxynitride film (B) toward the silicon oxynitride film (A) from the side of the island-like semiconductor layer.

Concerning the problem of peeling of film that occurs in the laminated-layer film shown in FIG. 1B, the film of which the composition continuously changes as shown in FIG. 1C has no interface and is, hence, free from the defect of peeling caused by stress that builds up on the interface.

As described above, the silicon oxynitride film (A) and the silicon oxynitride film (B) are laminated or the composition is continuously changed in order to stabilize the TFT properties. Concretely speaking, Vth is prevented from shifting, and properties are thermally stabilized and are prevented from varying.

Figure 2A:
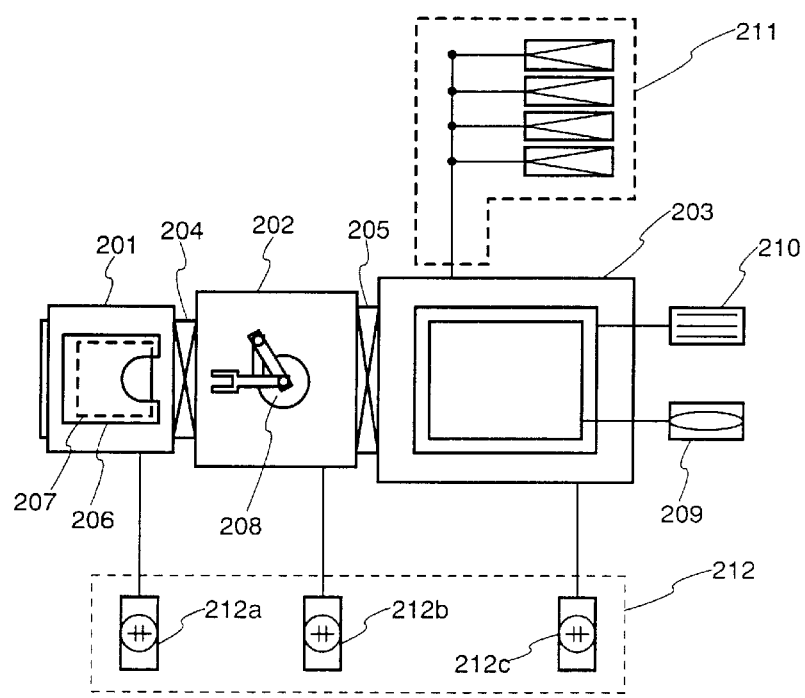
FIGS. 2A and 2B are views illustrating the constitution of a plasma CVD apparatus applied to the invention.
Figure 2B:
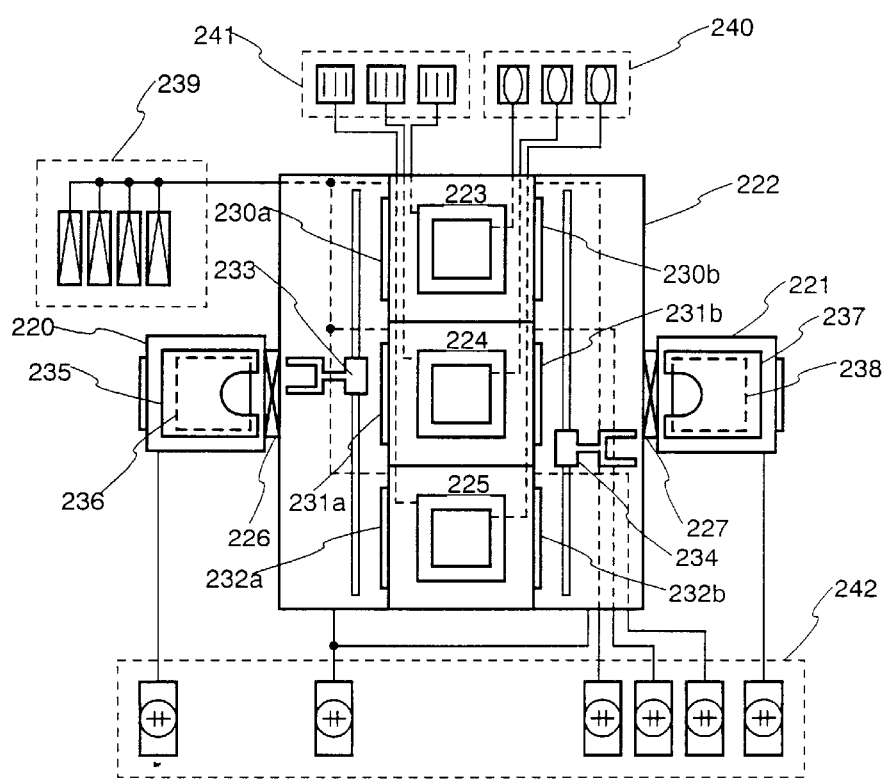

FIGS. 2A and 2B illustrate apparatuses adapted to constitute the present invention by forming the silicon oxynitride films (A) and (B). The plasma CVD apparatus shown in FIG. 2A includes a loading/unloading chamber 201, a carrier chamber 202 and a film-forming chamber 203. The chambers are separated by partitioning valves 204 and 205. Pressure-reducing means 212 (212a to 212c) equipped with a vacuum pump or the like are connected to the chambers. The loading/unloading 201 chamber contains a substrate 207 and a cassette 206 for holding the substrate which are transferred into the reaction chamber 203 by carrier means 208 provided in the carrier chamber 202. The reaction chamber 203 includes plasma-generating means 209, substrate-heating means 210 and gas-feeding means 211. In the reaction chamber 203, a film is formed by utilizing a plasma of glow discharge. The gas-feeding means 211 feeds such gases as $SiH_4$, $N_2O$, $H_2$ and $O_2$ while controlling their flow rates.

The reaction chamber consists of only one chamber but the silicon oxynitride films (A) and (B) can be continuously formed in the same reaction chamber by controlling the feeding amounts of $SiH_4$, $N_2O$, $H_2$ and by controlling the high-frequency electric power and the reaction pressure. When the substrate has a large size, rather, the floor area for installation can be decreased making it possible to save space.

The apparatus shown in FIG. 2B includes a loading chamber 220, an unloading chamber 221 and a common chamber 222. Reaction chambers 223 to 225 are provided in the common chamber 222. The loading chamber 220 and the unloading chamber 221 contain substrates 236, 238 and cassettes 235, 237 for holding them, and are separated from the common chamber by partitioning valves 226, 227. The substrate carried by carrier means 233 from the loading chamber 220 can be set to any one of the reaction chambers 223 to 225.

The reaction chambers 223 to 225 are provided with plasma-generating means 240, substrate-heating means 241 and gas-feeding means 239, and in which the film is formed by utilizing a plasma of glow discharge. The reaction chambers are provided with partitioning valves 230a to 232a and 230b to 232b, and the pressures therein are separately controlled by pressure-reducing means 242 equipped with a vacuum pump and the like. Therefore, the film-forming conditions are separately controlled to deposit the film. Or, the films can be formed simultaneously or in parallel in the respective reaction chambers to enhance the productivity.

The silicon oxynitride films (A) and (B) can be continuously formed in the same reaction chamber since the $SiH_4$, $N_2O$ and $H_2$ feeding rates, high-frequency electric power and reaction pressure can be controlled, and may assume the two-layer structure as described above, or the composition thereof may be continuously changed by changing the rate of feeding the gases with the passage of film-forming time. In any way, the apparatus of the constitution shown in FIG. 2B contributes to enhancing the productivity.

DETAILED DESCRIPTION OF PREFERRED EMBODIMENTS

Embodiment 1

Described below are the steps for forming a silicon oxynitride film and a semiconductor film (crystalline silicon film in this embodiment) by utilizing the present invention with reference to FIGS. 3 and 17.

Figure 17:
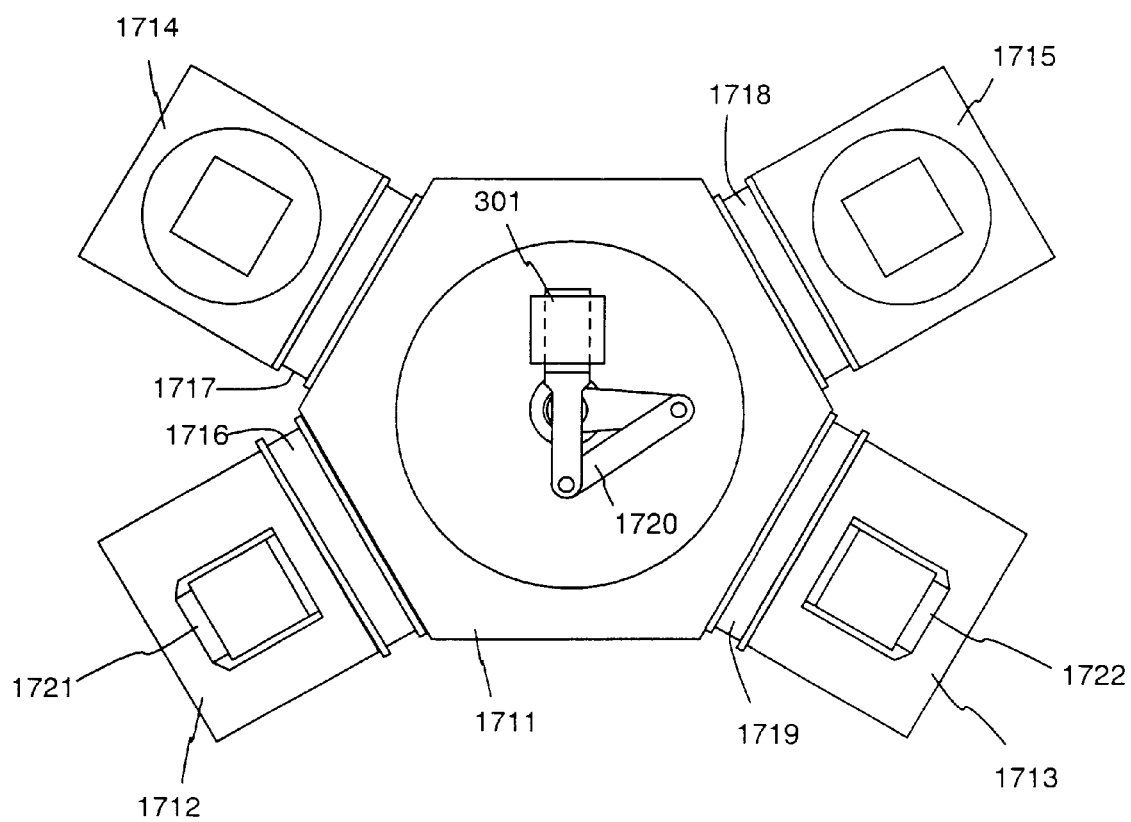
FIG. 17 is a view illustrating an apparatus for production (embodiment 1).

This Embodiment uses a plasma CVD apparatus of the piece-by-piece type (that includes a substrate carrier chamber 1711, load-locking chambers 1712 and 1713, a first film-forming chamber 1714, a second film-forming chamber 1715, and gate valves 1716 to 1719) as shown in FIG. 17.

First, a substrate 301 is set to a cassette 1721 in the load-locking chamber 1712. As the substrate 301, there can be used a barium borosilicate glass or an alumino-borosilicate glass as represented by a 7059 glass substrate or a #1737 glass substrate of Coning Co. The glass substrate contains trace amounts of alkali metal elements such as sodium and the like.

Then, the substrate 301 is introduced into the first film-forming chamber 1714 via a robot arm 1720 and is heated at about 400° C. Prior to being introduced into the first film-forming chamber 1714, the substrate 301 may be heated through a preheating chamber.

Figure 3:
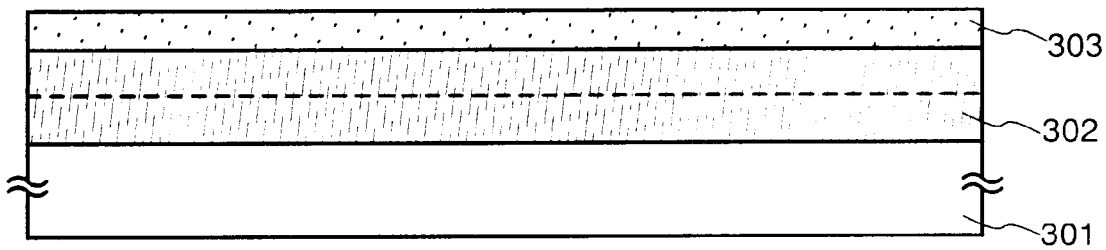
FIG. 3 is a view illustrating a step of formation according to the invention (embodiment 1)

Then, as shown in FIG. 3, a base film 302 is formed as a blocking layer to prevent contamination with alkali metal elements and other impurities from the substrate 301. Under the forming conditions shown in Table 1, the interface with the substrate is formed of a silicon oxynitride film (B), and the composition is continuously varied into a composition of the silicon oxynitride film (A) by controlling the flow rates of $SiH_4$, $N_2O$ and $H_2$ by using a mass flow controller. The silicon oxynitride film (B) containing nitrogen in large amounts is formed on the side of the substrate to prevent the diffusion if impurities into the active layer from the substrate, and the silicon oxynitride film (A) containing nitrogen in small amounts is formed on the side of the active layer to maintain a favorable interfacial state relative to the active layer. A dotted line in FIG. 3 represents a portion where the composition just assumes an intermediate value. This portion may be at the center in the thickness of the film, or may be closer to the semiconductor layer or to the substrate. Concretely speaking, formation of the film is commenced by, first, feeding $SiH_4$ at a rate of 5 SCCM, $N_2O$ at a rate of 120 SCCM and $H_2$ at a rate of 125 SCCM, setting Xg=0.96 at Xh=1, controlling the pressure to be 20 Pa, and supplying a high-frequency electric power of 27 MHz 0.4 $mW/cm^2$. Then, by taking the film-forming rate into consideration, the flow rate of $N_2O$ is increased up to 500 SCCM at a moment when the film formation is finished, the flow rate of $H_2$ is decreased to be 0 SCCM, and Xg is set to be 0.99 at Xh=0. The flow rate of $SiH_4$ is controlled from 5 SCCM to 4 SCCM, i.e., changed over at the portion of the dotted line in FIG. 3. The base film is thus formed maintaining a thickness of 150 nm. The thickness of the base film is in no way limited thereto only but may assume a thickness of 50 nm to 300 nm (preferably, from 80 nm to 150 nm), and the silicon oxynitride films (A) and (B) may be laminated as described above. The film-forming conditions shown here are only examples, and no limitation is imposed thereon provided the compositions shown in Table 2 are obtained.

The plasma cleaning treatment conducted prior to forming the base film is effective. The plasma cleaning treatment is conducted for 2 minutes by forming a plasma under a pressure of 20 Pa with a high-frequency electric power of 0.2 $W/cm^2$ while introducing hydrogen at a rate of 200 SCCM. Or, the plasma treatment may similarly be effected under a pressure of 40 Pa by introducing $H_2$ at a rate of 100 SCCM and oxygen at a rate of 100 SCCM. Or, the treatment may be conducted for several minutes by introducing $N_2O$ and hydrogen under a pressure of 10 Pa to 70 Pa with a high-frequency power density of 0.1 to 0.5 $W/cm^2$. The substrate temperature is maintained at 300° C. to 450° C. and, preferably, at 400° C. In this step, the surface of the substrate 301 is cleaned with the plasma to remove boron and phosphorus that are adhered as well as to remove contaminating substances such as organic matters.

There is thus obtained the silicon oxynitride film 302 in which the composition ratios of N, O and H continuously change in the film. The silicon oxynitride film 302 has a gradient of composition in the film, the amounts of nitrogen and hydrogen continuously increasing toward the interface on the side of the substrate.

Then, the gas in the first film-forming chamber 1714 is evacuated or is substituted with an inert gas such as $N_2$, and the substrate is carried into the second film-forming chamber 1715 through the substrate carrier chamber 1711.

Next, the semiconductor film 303 is formed on the silicon oxynitride film 302 in contact therewith. Here, an amorphous silicon film is formed in the second film-forming chamber 1715.

Here, the silicon oxynitride film 302 and the semiconductor film can be formed by the same film-forming method. Therefore, the two films may be continuously formed in the same chamber. Upon continuously forming them, the surface of the silicon oxynitride film 302 that is formed is prevented from being contaminated at the time of being carried, making it possible to suppress a dispersion in the TFT characteristics and to suppress a change in the threshold voltage. It is further made possible to shorten the processing time and to enhance the productivity.

Next, the substrate on which the amorphous silicon film is formed is carried into the load-locking chamber 1713 through the substrate carrier chamber 1711, and is set into the cassette 1722.

Then, the substrate on which the silicon oxynitride film 302 and the amorphous semiconductor film are laminated, is crystallized according to known crystallization technique to form a crystalline semiconductor film.

In the subsequent steps, the TFT may be formed according to known technique.

Embodiment 2

Described below with reference to FIGS. 4A to 10 is a case where the invention is applied to an active matrix-type liquid crystal display device in which a pixel matrix circuit and a driver circuit are integrally formed together on the same substrate.

FIG. 4A is a sectional view, wherein reference 101 denotes an insulating substrate which may be, for example, a 1737 glass substrate of Coning Co. On the glass substrate are formed a laminated-layer film of a silicon oxynitride film 102 and an amorphous semiconductor film in which the composition ratio of N, O and H is continuously changing, as a base film for preventing the diffusion of impurities from the substrate. The laminated-layer film is formed by the method described in Embodiment 1, i.e., a base film of a thickness of 150 nm and an amorphous silicon film of a thickness of 50 nm are formed, respectively.

Next, though it may vary depending upon the content of hydrogen, the amorphous silicon film is dehydrogenated by being heated, preferably, at 400° C. to 550° C. for several hours so as to be crystallized to thereby decrease the hydrogen content to be not larger than 5 atomic %. This makes it possible to prevent the surface of the film from being coarsened. When the amorphous silicon film is formed by the plasma CVD method by using $SiH_4$ and Ar as reaction gases maintaining the temperature of the substrate at 300° C. to 400° C., the hydrogen concentration in the amorphous silicon film can be suppressed to be not larger than 5 atomic %. In such a case, no dehydrogenation treatment is necessary.

The amorphous silicon film may be crystallized by a known laser-annealing method or a heat-annealing method. When the laser-annealing method is employed, the source of light will be an excimer laser or an argon laser of the pulse oscillation type or of the continuous light emission type. When the excimer laser of the pulse oscillation type is employed, the laser beam is formed into a linear beam to effect the laser annealing. The laser annealing conditions are suitably selected by a person who executes the annealing. For example, the laser pulse oscillation frequency is 30 Hz and the laser energy density is 100 $mJ/cm^2$ to 500 $mJ/cm^2$ (typically, 300 $mJ/cm^2$ to 400 $mJ/cm^2$). The linear beam is projected onto the whole surface of the substrate. The overlapping factor of the linear beam at this moment is 80 to 90%. The crystalline semiconductor layer is thus formed. According to a further method, a YAG laser of the pulse oscillation type is used. The second harmonics (532 nm) to the third harmonics are used, the laser pulse oscillation frequencies are selected to be 1 Hz to 20000 Hz (preferably, 10 Hz to 10000 Hz), and the laser energy density is selected to be 200 $mJ/cm^2$ to 600 $mJ/cm^2$ (typically, 300 $mJ/cm^2$ to 500 $mJ/cm^2$). The linear beam is projected onto the whole surface of the substrate. The overlapping factor of the linear beam at this moment is 80% to 90%. When the second harmonics are used, heat is uniformly transmitted even into the semiconductor layer and the crystallization is accomplished despite the energy of irradiation is dispersed to some extent. This increases the machining margin and decreases dispersion in the crystallization. Besides, a high pulse frequency helps increase the throughput. When the heat-annealing method is employed, the annealing is executed by using an annealing furnace in a nitrogen atmosphere at about 600° C. to 660° C. In any way, when the amorphous semiconductor layer is crystallized, the atoms are rearranged to become dense. Therefore, the thickness of the crystalline semiconductor layer that is formed decreases by 1% to 15% compared to the thickness of the initial amorphous semiconductor layer. In this Embodiment, the KrF excimer laser beam of the pulse oscillation type is converged into a linear beam and is projected onto the amorphous silicon film to form a crystalline silicon film.

The thus formed crystalline silicon film is patterned like an island by using a first photomask and is formed, by dry etching, into an active layer 103 of a p-channel TFT in the driver circuit, into an active layer 104 of an n-channel TFT, and into an active layer 105 of a pixel TFT.

In this Embodiment, the island-like semiconductor layer is transformed from an amorphous silicon film into a crystalline silicon film. It is, however, also allowable to use a fine crystalline silicon film or to directly form a crystalline silicon film.

Next, a gate-insulating film 106 comprising chiefly a silicon oxide or a silicon nitride is formed covering the island-like semiconductor layers 103, 104 and 105. The gate-insulating film 106 may be the silicon oxynitride film formed by the plasma CVD method by using $N_2O$ and $SiH_4$ as starting materials maintaining a thickness of 10 nm to 200 nm and, preferably, 50 nm to 150 nm. Here, the film is formed maintaining a thickness of 100 nm (FIG. 4A).

Then, there are formed resist masks 107, 108, 109, 110 and 111 covering the semiconductor layer 103 and the channel-forming regions of the semiconductor layers 104 and 105 by using a second photomask. Here, the resist mask 109 may be formed even on a region where wiring is to be formed.

Then, an n-type impurity element is added to form a second impurity region. Here, the second impurity region is formed by the ion-doping method by using phosphine ($PH_3$). In this step, the acceleration voltage is set to 80 keV to add phosphorus to the underlying semiconductor layer through the gate-insulating film 106. The concentration of phosphorus added to the semiconductor layer is desirably in a range of from $1\times10^{16}$ to $1\times10^{19}$ atoms/cm$^3$, and is set here to be $1\times10^{18}$ atoms/cm$^3$. There are thus formed regions 112, 113, 114, 115 and 116 where phosphorus is added to the semiconductor layers. Here, part of the region to where phosphorus is added is a second impurity region that works as an LDD region (FIG. 4B).

Thereafter, the resist mask is removed, and a first electrically conductive layer 117 is formed on the whole surface. The first electrically conductive layer 117 is a single-layer film or a laminated-layer film of an electrically conductive material comprising chiefly an element selected from Ta, Ti, Mo, W, Cr and Al, or silicon or silicide containing phosphorus. There can be used, for example, such a compound as WMo, TaN, MoTa, WSix (2.4<x<2.7). The first electrically conductive layer 117 has a thickness of 100 to 1000 nm and, preferably, 150 to 400 nm. Here, Ta is formed by sputtering (FIG. 4C).

Next, resist masks 118, 119, 120, 121, 122 and 123 are formed by using a third photomask. The third photomask is for forming a gate electrode of a p-channel TFT, gate wirings of the CMOS circuit and of the pixel portion, and a gate bus line. The gate electrode of the n-channel TFT is formed in a subsequent step. Therefore, resist masks 119 and 123 are so formed that the first electrically conductive layer 117 remains on the whole surfaces of the semiconductor layers 104 and 105 (FIG. 5A).

Unnecessary portions of the first electrically conductive layer are removed by dry etching. Ta is etched by a mixture gas of $CF_4$ and $O_2$. Then, a gate electrode 124, gate wirings 126, 128, and a gate bus line 127 are formed.

The resist masks 118, 119, 120, 121, 122 and 123 are left, and a p-type third impurity element is added to a portion of the semiconductor layer 103 in which a p-channel TFT is formed. Here, boron is added as an impurity element by the ion-doping method by using diborane ($B_2H_6$). Boron is added at a concentration of $2\times10^{20}$ atoms/cm$^3$ with the acceleration voltage of 80 keV. Then, as shown in FIG. 5A, there are formed third impurity regions 130 and 131 in which boron is added at a high concentration.

After the resist masks formed in FIG. 5A are removed, there are newly formed resist masks 132, 133, 134, 135, 136, 137 and 138 using a fourth photomask. The fourth photomask is for forming gate electrodes of the n-channel TFTs, and there are formed gate electrodes 139, 140, 141 and a capacitor electrode 142 by dry etching. Here, the gate electrodes 139, 140 and 141 are so formed as to be overlapped on portions of the second impurity regions 112, 113, 114, 115 and 116 (FIG. 5B).

After the resist masks are removed, there are newly formed resist masks 143, 144, 145, 146, 147, 148 and 149. The resist masks 144, 147 and 148 are formed so as to cover the gate electrodes 139, 140 and 141 of the n-channel TFTs and to cover portions of the second impurity region. Here, the resist masks 144, 147 and 148 are for determining the offset amounts of the LDD regions.

Then, first impurity regions are formed by adding an n-type impurity element. There are formed first impurity regions 151, 152 that serve as source regions, and first impurity regions 150, 153 and 154 that serve as drain regions. Here, the impurity element is added by the ion-doping method by using phosphine ($PH_3$). Here, too, the acceleration voltage is set to be 80 keV to add phosphorus to the underlying semiconductor layer through the gate-insulating film 106. The phosphorus concentration in this region is higher than that in a step where the first impurity element is added for imparting the n-type, and is preferably $1\times10^{19}$ to $1\times10^{21}$ atoms/cm$^3$ and is set to be $1\times20^{20}$ atoms/cm$^3$ here (FIG. 5C).

After the steps up to FIG. 5C have finished, a first interlayer insulating film 155 is formed on the gate electrodes and on the gate-insulating films. The first interlayer insulating film may be formed of a silicon oxide film, a silicon oxynitride film, a silicon nitride film, or a laminated-layer film of a combination thereof. In any way, the first interlayer insulating film 155 is formed of an inorganic insulating material. The first interlayer insulating film 155 has a thickness of 100 nm to 200 nm. Here, when the silicon oxide film is used, the film is formed by the plasma CVD method by mixing TEOS and $O_2$ together, under a reaction pressure of 40 Pa maintaining the substrate at a temperature of 300° C. to 400° C. and by generating an electric discharge with a high-frequency (13.56 MHz) power density of 0.5 W/cm$^2$ to 0.8 W/cm$^2$. When the silicon oxynitride film is to be used, further, the film may be the silicon oxynitride film formed of $SiH_4$, $N_2O$ and $NH_3$ by the plasma CVD method or may be the silicon oxynitride film formed of $SiH_4$ and $N_2O$. The forming conditions in this case are a reaction pressure of 20 Pa to 200 Pa, a substrate temperature of 300° C. to 400° C., and a high-frequency (60 MHz) power density of 0.1 W/cm$^2$ to 1.0 W/cm$^2$. Or, there may be used a hydrogenated silicon oxynitride film formed of $SiH_4$, $N_2O$ and $H_2$. The silicon nitride film can similarly be formed of $SiH_4$ and $NH_3$ by the plasma CVD method.

The heat treatment is then executed. The heat treatment is necessary for activating the n-type- or p-type impurity elements added at their respective concentrations. When the first interlayer insulating film is a laminated-layer film, the insulating film which is the lower layer is formed and, then, the heat treatment is conducted. This step can be carried out by a heat-annealing method using an electric heating furnace, by a laser-annealing method using the excimer laser mentioned above or by a rapid thermal annealing (RTA) method using a halogen lamp. Here, the activation is effected by the heat-annealing method. The heat treatment is conducted in a nitrogen atmosphere containing oxygen at a concentration of not larger than 1 ppm and, preferably, not larger than 0.1 ppm at 400° C. to 700° C. and, preferably, at 500° C. to 600° C. or, in this case, at 500° C. for 4 hours.

After the step of activation by heating, the heat treatment is conducted in an atmosphere containing 3 to 100% of hydrogen at 300° C. to 450° C. for 1 to 12 hours in order to hydrogenate the island-like semiconductor layers. This step is to terminate the dangling bonds of the semiconductor layer with hydrogen that is thermally excited. As another means of hydrogenation, there may be conducted a plasma hydrogenation (using hydrogen excited by plasma). In either case, it is desired that the defect density in the semiconductor layer is not higher than $10^{16}/cm^3$. For this purpose, hydrogen may be added at a concentration of about 0.01 to 0.1 atomic %.

The first interlayer insulating film 155 is then patterned to form source regions of the TFTs and to form contact holes that reach the drain regions. Then, there are formed source electrodes 156, 157, 158 and drain electrodes 159, 160. In this Embodiment, though not diagramed, there are continuously formed by sputtering a Ti film maintaining a thickness of 100 nm, an Al film containing Ti maintaining a thickness of 300 nm and a Ti film maintaining a thickness of 150 nm, and this three-layer film is patterned so as to be used as electrodes.

Through the above step, there are formed a channel-forming region 164, first impurity regions 167, 168, and second impurity regions 165, 166 in the n-channel TFT of the CMOS circuit. Here, the second impurity regions include regions (GOLD regions) 165a and 166a overlapped on the gate electrodes, and regions (LDD regions) 165b and 166b not overlapped on the gate electrodes. The first impurity region 167 works as a source region, and the first impurity region 168 works as a drain region.

In the p-channel TFT are formed a channel-forming region 161 and third impurity regions 162 and 163. The third impurity region 162 works as a source region, and the third impurity region 163 works as a drain region.

The n-channel TFT in the pixel portion has a multi-gate structure and in which are formed channel-forming regions 169, 170, first impurity regions 175, 176, and second impurity regions 171, 172, 173, 174. The second impurity regions include regions 171a, 172a, 173a and 174a that are overlapped on the gate electrodes, and regions 171b, 172b, 173b and 174b that are not overlapped thereon.

Figure 6:
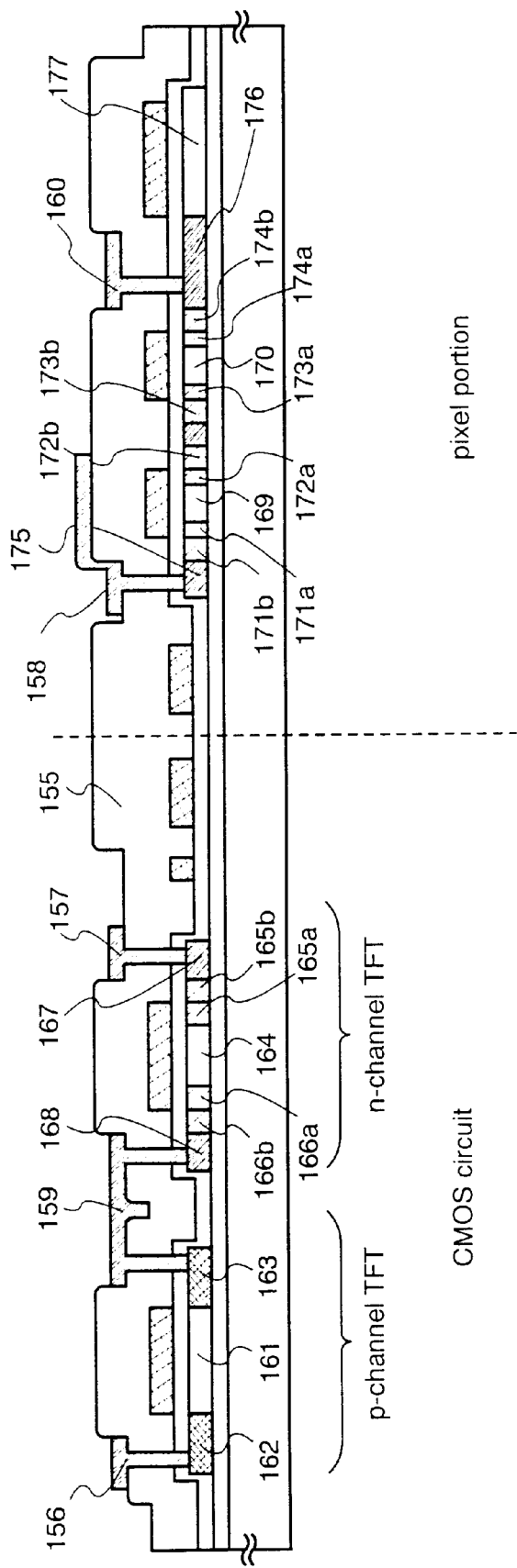
FIG. 6 is a view illustrating a step for forming AM-LCD (embodiment 2)

Thus, as shown in FIG. 6, on the substrate 101 are formed a CMOS circuit and an active matrix substrate in which a pixel portion is formed. On the drain side of the n-channel TFT of the pixel portion, there is simultaneously formed a storage capacitor by a low-concentration impurity region 177 to which an n-type impurity element is added at the same concentration as the second impurity region, a gate-insulating film 106 and a capacitor electrode 142.

Next, described below are the steps for fabricating an active matrix-type liquid crystal display device from an active matrix substrate.

A passivation film 178 is formed on the active matrix substrate in a state of FIG. 6. The passivation film 178 is a silicon nitride film formed maintaining a thickness of 300 nm. When the passivation film that is formed is subjected to the hydrogenation treatment, TFT properties are improved offering favorable results. For example, the heat treatment should be effected in an atmosphere containing 3% to 100% of hydrogen at 300° C. to 450° C. for 1 to 12 hours. Or, the similar effects are obtained even by the plasma hydrogenation method.

Figure 7A:
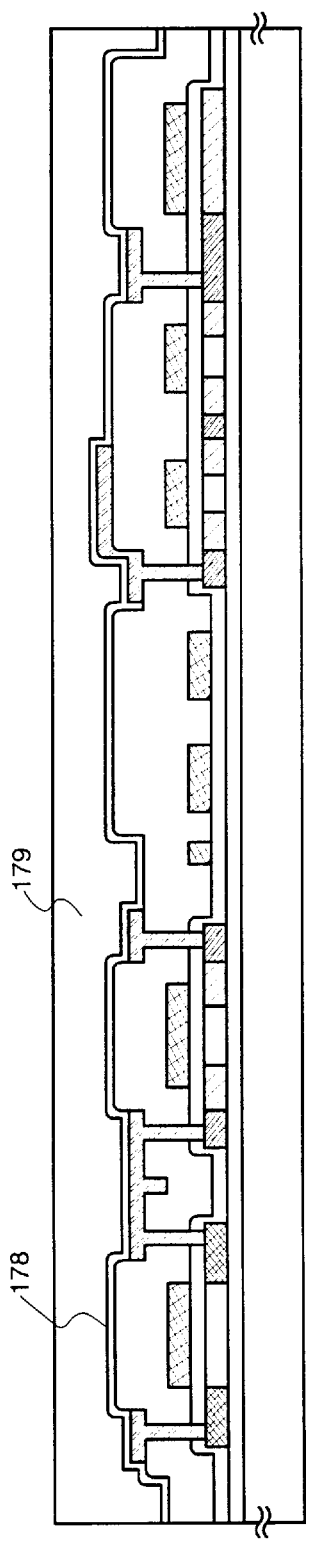
FIGS. 7A and 7B are views illustrating steps for forming AM-LCD (embodiment 2)

Then, a second interlayer insulating film 179 of an organic resin is formed maintaining a thickness of about 1000 nm. As the organic resin film, there can be used polyimide, acrylic resin, polyimideamide, etc. The advantage of using the organic resin film is that the film is easily formed, the specific inductivity is so low that the parasitic capacity can be decreased, and excellent flatness is obtained. It is also allowable to use an organic resin film other than those described above. Here, a polyimide of the type that is polymerized by heating is applied onto the substrate and is fired at 300° C. (FIG. 7A).

Figure 7B:
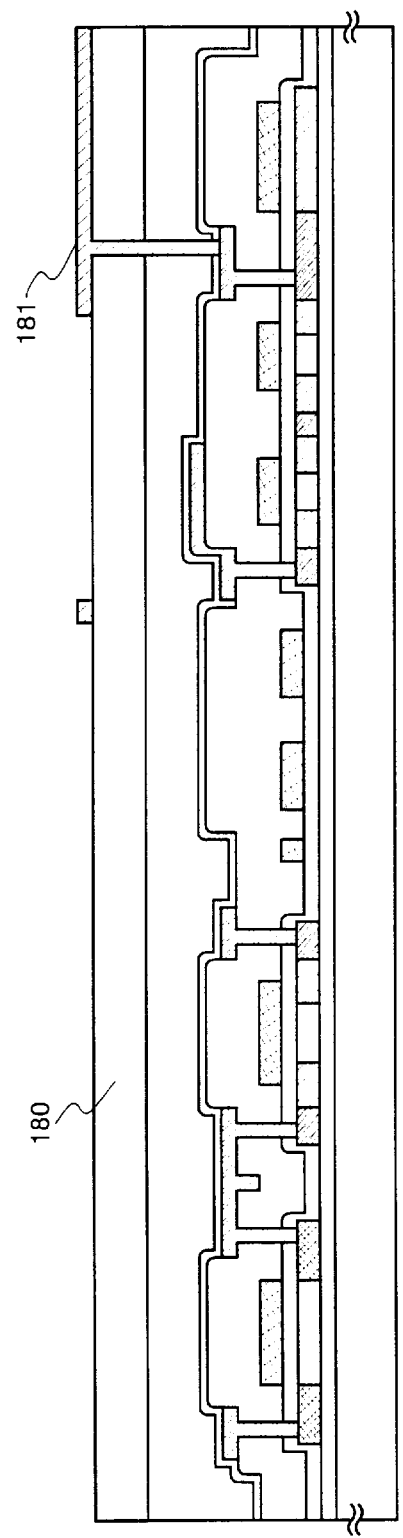

Further, a third interlayer insulating film 180 is formed. The third interlayer insulating film 180 is formed of an organic resin film such as of polyimide. The third interlayer insulating film 180, second interlayer insulating film 179 and passivation film 178 are selectively removed to form a contact hole that reaches the drain electrode 160 to form a pixel electrode 181. The pixel electrode 181 may be formed of a transparent electrically conductive film in the case of the transmission-type liquid crystal display device and may be formed of a metal film in the case of the reflection-type liquid crystal display device. Here, in order to fabricate the transmission-type liquid crystal display device, an indium-tin oxide (ITO) film is formed by sputtering maintaining a thickness of 100 nm and is patterned to form the pixel electrode 181 (FIG. 7B).

Figure 8:
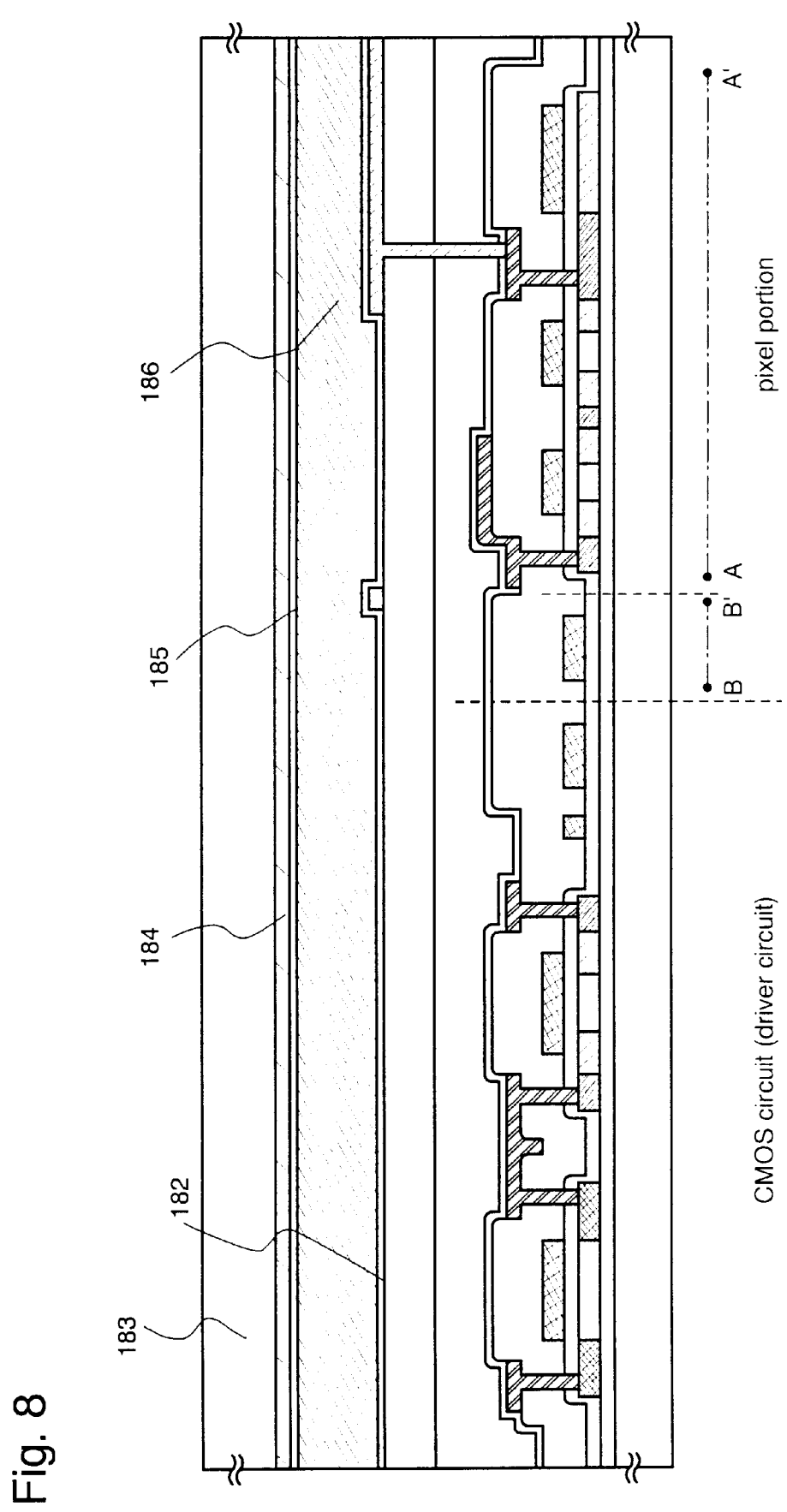
FIG. 8 is a view illustrating, in cross section, the structure of an active matrix-type liquid crystal display device (embodiment 2)

Referring next to FIG. 8, an alignment film 182 is formed in contact with the third interlayer insulating film 180 and the pixel electrode 181. The polyimide resin is, usually, much used for the alignment film of the liquid crystal display device. A transparent electrically conductive film 184 and an alignment film 185 are formed on the substrate 183 of the opposing side. The alignment film that is formed is rubbed such that the liquid crystal molecules are arranged in parallel maintaining a pre-tilted angle.

The active matrix substrate on which a pixel portion and a CMOS circuit are formed through the above steps, and an opposing substrate, are stuck together via a sealing member and a spacer (which are not shown) through known steps of assembling the cells. Then, a liquid crystal material 186 is poured into between the two substrates and is completely sealed with a sealing agent (not shown). Thus, an active matrix-type liquid crystal display device shown in FIG. 8 is completed.

Figure 9:
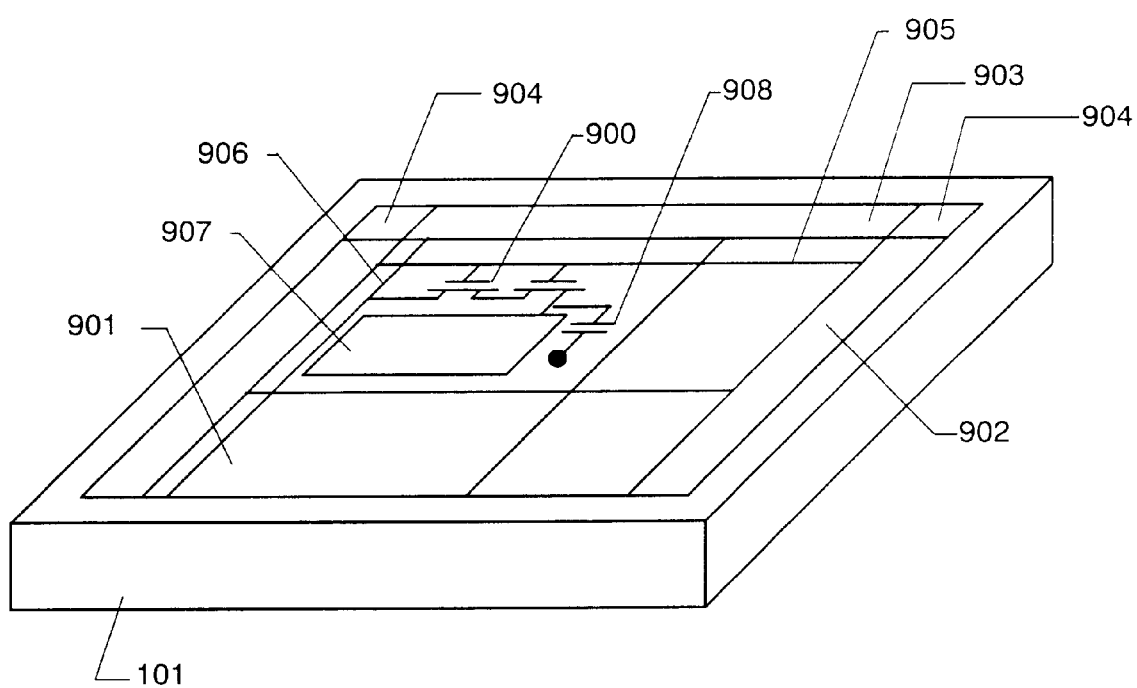
FIG. 9 is a view illustrating the appearance of AM-LCD (embodiment 2)

Next, the constitution of the active matrix-type liquid crystal display device of this Embodiment will be described with reference to FIGS. 9 and 10. FIG. 9 is a perspective view of the active matrix substrate of this Embodiment. The active matrix substrate is constituted by a pixel portion 901 formed on a glass substrate 101, a scanning (gate) line driver circuit 902, a signal (source) line driver circuit 903 and a logic circuit 904. The pixel TFT 900 in the pixel portion is an n-channel TFT, and a driver circuit provided in the periphery is constituted based on the CMOS circuit. The scanning (gate) line driver circuit 902 and the signal (source) line driver circuit 903 are connected to the pixel portion 901 through a gate wiring 905 and a source wiring 906. The pixel portion 901 is formed by the pixel TFT 900, pixel electrode 907 and storage capacitor 908.

In this Embodiment, the pixel TFT 900 has a double gate structure. It, however, may have a single gate structure or a triple-gate or a multi-gate structure. The structure of the active matrix substrate of this Embodiment is not limited to the structure of the Embodiment only. The structure of this invention has a feature in the constitution of the base film. The constitution in other respects may be suitably determined by a person who implements the invention.

Figure 10:
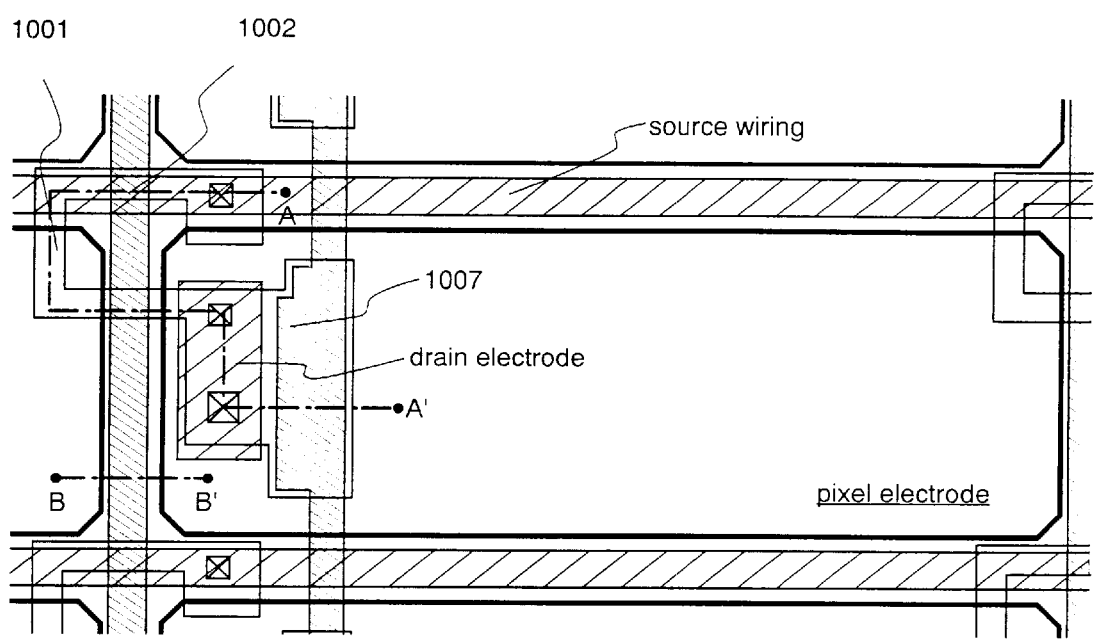
FIG. 10 is a top view illustrating part of a pixel portion (embodiment 2)

FIG. 10 is a top view illustrating part of the pixel portion 901, and is a top view of nearly a whole pixel. An n-channel TFT is provided in the pixel portion. A gate electrode 1002 intersects an underlying semiconductor layer 1001 via a gate-insulating film that is not shown. Though not shown, in the semiconductor layer are formed a source region, a drain region and a first impurity region. On the drain side of the pixel TFT, a storage capacitor 1007 is formed by a semiconductor layer, a gate-insulating film and an electrode formed of the same material as the gate electrode. The sectional structure along A–A' and B–B' shown in FIG. 10 corresponds to the sectional view of pixel portion shown in FIG. 8.

Embodiment 3

In this Embodiment, the crystalline semiconductor film used as a semiconductor layer in Embodiment 2 is formed by the thermal crystallization method by using a catalytic element. When the catalytic element is to be used, it is desired to use techniques disclosed in Japanese Patent Laid-Open Nos. 7-130652 and 8-78329.

Figure 11A:
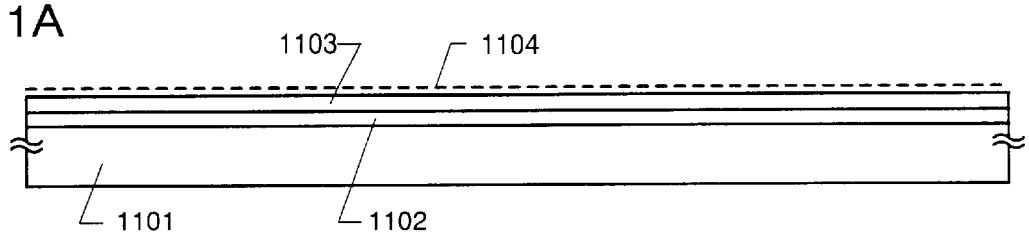
FIGS. 11A and 11B are views illustrating steps for forming AM-LCD (embodiment 3)
Figure 11B:
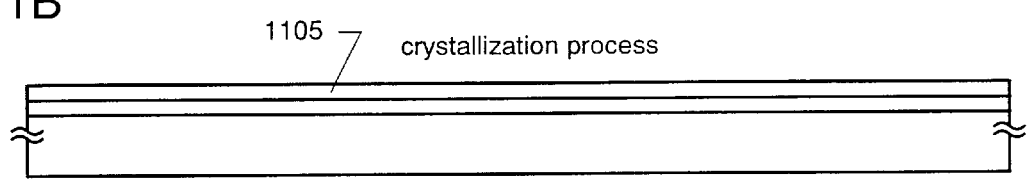

FIGS. 11A and 11B illustrate examples of when the technique disclosed in Japanese Patent Laid-Open No. 7-130652 is applied to this invention. As a base film on the substrate 1101, first, a silicon oxynitride film 1102 is formed in which the composition of N, O and H is continuously varying, and an amorphous silicon film 1103 is formed thereon. The laminated-layer film is formed by forming the base film maintaining a thickness of 200 nm and the amorphous silicon film maintaining a thickness of 50 nm by the method described in Embodiment 1.

Next, a solution of nickel acetate containing nickel which is a catalytic element in an amount of 10 ppm on the basis of weight is applied by using a spin coater as shown in FIG. 11A. Thus, nickel which is an element that promotes the crystallization is added to the amorphous silicon film to form a nickel-containing layer 1104.

Next, the dehydrogenation is effected at 500° C. for one hour to decrease the hydrogen content to not larger than 5 atomic %, heat treatment is effected at 500° C. to 650° C. for 4 to 12 hours, for example, at 550° C. for 8 hours thereby to form a crystalline silicon film 1105. The thus obtained crystalline silicon film 1105 exhibits very excellent crystallinity (FIG. 11B).

Figure 12A:
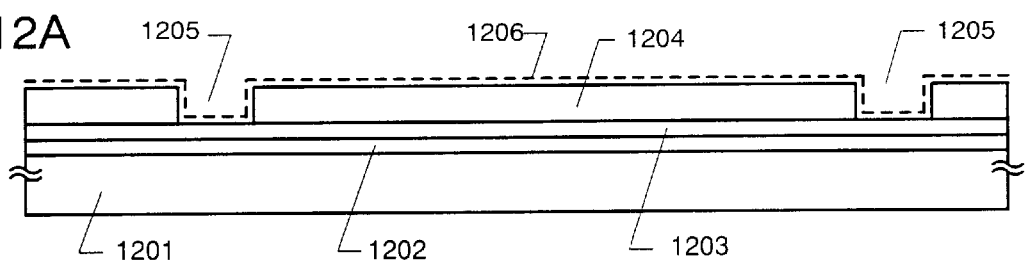
FIGS. 12A and 12B are views illustrating steps for forming AM-LCD (embodiment 3)
Figure 12B:
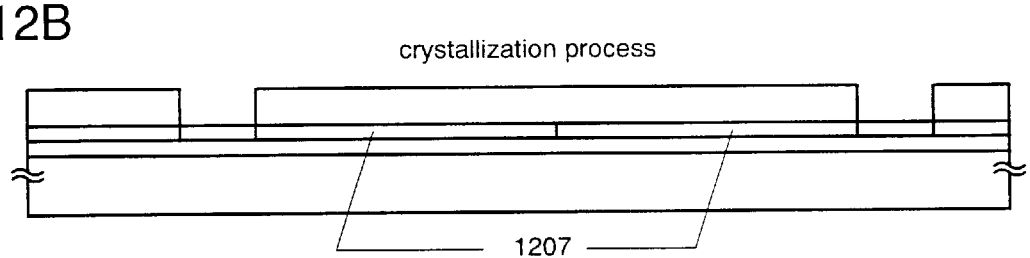

Further, the technique disclosed in Japanese Patent Laid-Open No. 8-78329 is to selectively crystallize the amorphous semiconductor film by selectively adding a catalytic element. FIGS. 12A and 12B illustrate cases where the above techniques are applied to this invention.

First, a base film 1202 including a silicon oxynitride film in which the composition of N or O is continuously changing, is formed on a glass substrate 1201, and an amorphous silicon film 1203 and a silicon oxide film 1204 are continuously formed thereon. Here, the silicon oxide film 1204 has a thickness of 150 nm. The base film 1202 is formed here by the method described in Embodiment 1.

Next, the silicon oxide film 1204 is patterned to selectively form openings 1205 and, then, a solution of nickel acetate containing nickel in an amount of 10 ppm on the basis of weight is applied thereon. Thus, the nickel-containing layer 1206 is formed so as to come in contact with the amorphous silicon film 1203 on the bottom portions only of the openings 1205 (FIG. 12A).

Next, the heat treatment is effected at 500° C. to 650° C. for 4 to 24 hours, for example, at 570° C. for 14 hours to form a crystalline silicon film 1207. In this step of crystallization, a portion of the amorphous silicon film to where nickel comes in contact is crystallized, first, and the crystallization proceeds in the transverse direction from this portion. The thus formed crystalline silicon film 1207 is constituted by a set of rod-like or needle-like crystals, the individual crystals growing maintaining a predetermined directivity if viewed macroscopically, and offers an advantage of regular crystallinity (FIG. 12B).

As the catalytic element that can be used in the above two techniques, there can be used nickel (Ni) as well as such elements as germanium (Ge), iron (Fe), palladium (Pd), tin (Sn), lead (Pb), cobalt (Co), platinum (Pt), copper (Cu) and gold (Au).

The crystalline semiconductor film (inclusive of crystalline silicon film, crystalline silicon-germanium film, etc.) is formed by the above technique and is patterned to form a semiconductor layer of a crystalline TFT. The TFT prepared by using the crystalline semiconductor film by using the technique of this Embodiment exhibits excellent properties. For this purpose, however, a high reliability is required. Upon employing the TFT structure of this invention, however, it is made possible to prepare a TFT by utilizing the technique of this Embodiment to a maximum degree.

Embodiment 4

As a method of forming the semiconductor layer used in Embodiment 3, this Embodiment deals with a case where a crystalline semiconductor film is formed by using the catalytic element with the amorphous semiconductor film as an initial film and, then, the catalytic element is removed from the crystalline semiconductor film. This is done by using the technique disclosed in Japanese Patent Laid-Open No. 10-135468 or 10-135469.

The technique disclosed in this publication is for removing the catalytic element used for the crystallization of the amorphous semiconductor film by utilizing the gettering action of phosphorus after the crystallization. By utilizing this technique, the concentration of catalytic element in the crystalline semiconductor film can be decreased to be not larger than $1\times10^{17}$ atoms/cm$^3$ and, preferably, not larger than $1\times10^{16}$ atoms/cm$^3$.

Figure 13A:
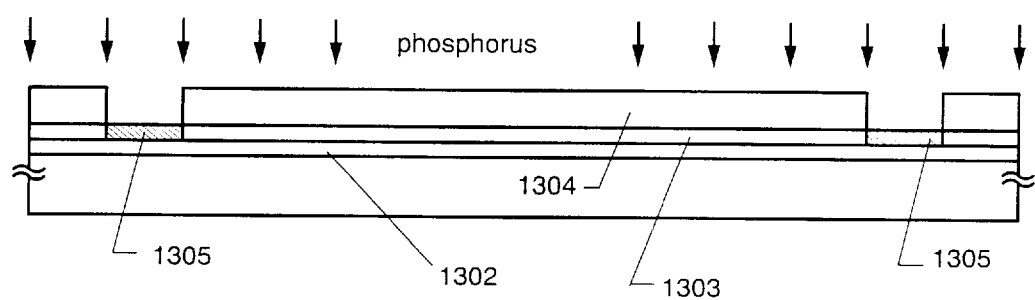
FIGS. 13A and 13B are views illustrating steps for forming AM-LCD (embodiment 4)
Figure 13B:
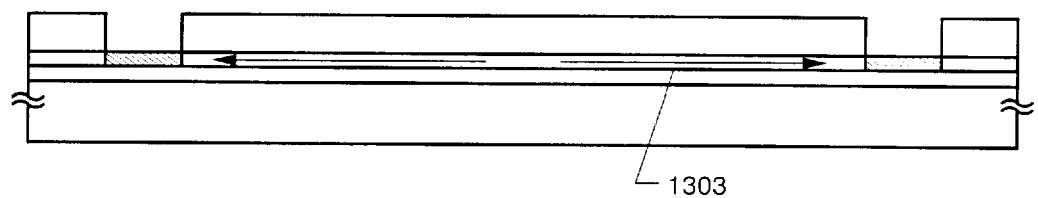

The constitution of this Embodiment will be described with reference to FIGS. 13A and 13B. Here, a non-alkali glass substrate as represented by a 1737 substrate of Coning Co. is used. FIG. 13A illustrates a state where a base film 1302 and a crystalline silicon film 1303 are formed on a substrate 1301 by utilizing the crystallization technique described in Embodiment 3. The method described in Embodiment 1 is used here for forming the base film 1302. Then, a silicon oxide film 1304 for masking is formed maintaining a thickness of 150 nm on the surface of the crystalline silicon film 1303, and openings are formed therein by patterning to expose the crystalline silicon film. Then, phosphorus is added to form a region 1305 where phosphorus is added to the crystalline silicon film.

In this state, the heat treatment is effective in a nitrogen atmosphere at 550° C. to 800° C. for 5 to 24 hours, for example, at 600° C. for 12 hours. Then, the region 1305 where phosphorus is added to the crystalline silicon film works as a gettering site, and the catalytic element remaining in the crystalline silicon film 1303 is segregated in the region 1305 where phosphorus is added. (FIG. 13B)

Then, the silicon oxide film 1304 for masking and the region 1305 to where phosphorus is added are removed by etching to form a crystalline silicon film in which the concentration of catalytic element used in the step of crystallization is lowered to be not larger than $1 \times 10^{17}$ atoms/cm$^3$. The crystalline silicon film can be directly used as a semiconductor layer of TFT of this invention, and the thus prepared TFT has a small off current value and good crystallinity and, hence, exhibits a high electric field effect mobility and favorable characteristics.

Embodiment 5

The TFTs formed by this invention can be used in a variety of electro-optical devices (typically, active matrix-type liquid crystal display, etc.). That is, the invention can be applied to every electronic equipment that incorporates the above electro-optical device and semiconductor circuit as parts.

Examples of the electronic equipment include video cameras, digital cameras, projectors (rear type or front type), head mount displays (goggle-type display), car navigation systems, car stereo systems, personal computers, portable data terminals (mobile computers, cellular phones, electronic books, etc.) and the like. Their examples are shown in FIGS. 14A to 16C.

Figure 14A:
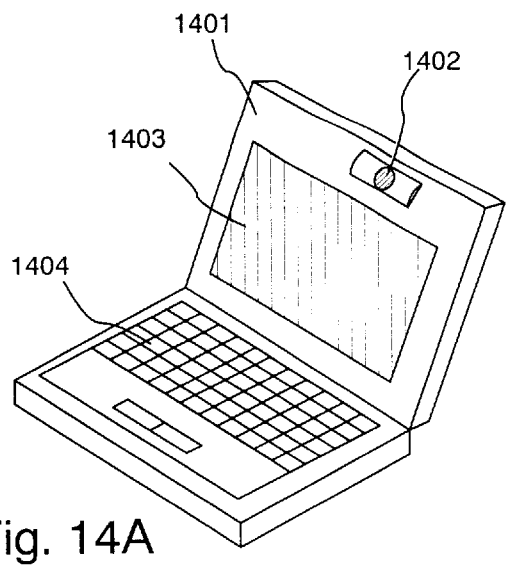
FIGS. 14A to 14F are views illustrating examples of electronic devices (embodiment 5)

FIG. 14A illustrates a personal computer which includes a main body 1401, a picture input unit 1402, a display unit 1403, a keyboard 1404 and the like. The invention can be applied to the picture input unit 1402, to the display unit 1403 and to any other signal control circuit.

Figure 14B:
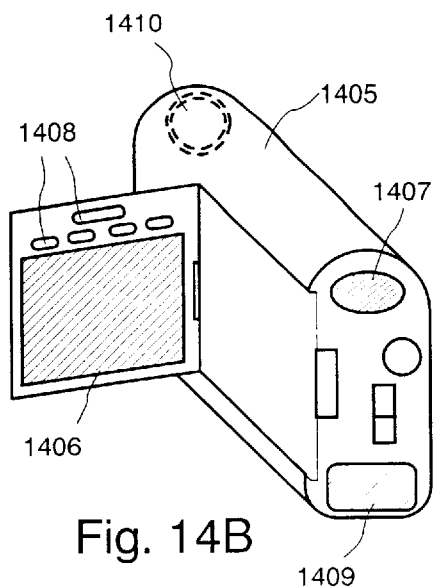

FIG. 14B illustrates a video camera which includes a main body 1405, a display unit 1406, a voice input unit 1407, operation switches 1408, a battery 1409, a picture unit 1410 and the like. The invention can be applied to the display unit 1406 and to any other signal control circuit.

Figure 14C:
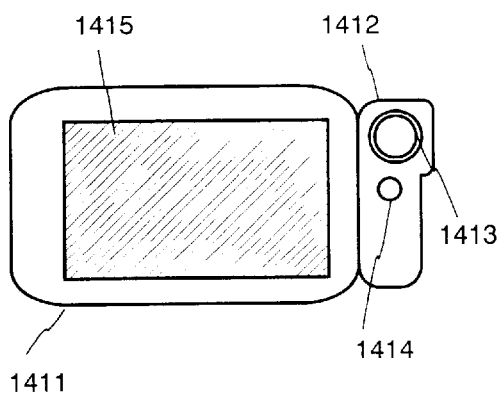

FIG. 14C illustrates a mobile computer which includes a main body 1411, a camera unit 1412, a picture unit 1413, operation switches 1414, a display unit 1415 and the like. The invention can be applied to the display unit 1415 and to any other signal control circuit.

Figure 14D:
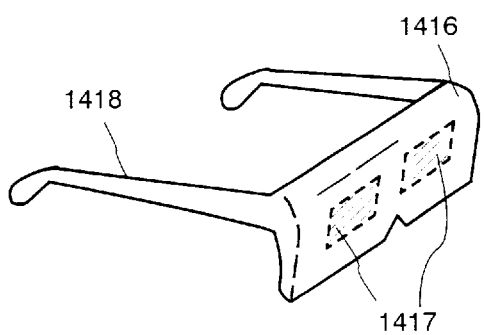

FIG. 14D illustrates a goggle-type display which includes a main body 1416, a display unit 1417, an arm unit 1418 and the like. The invention can be applied to the display unit 1417 and to any other signal control circuit.

Figure 14E:
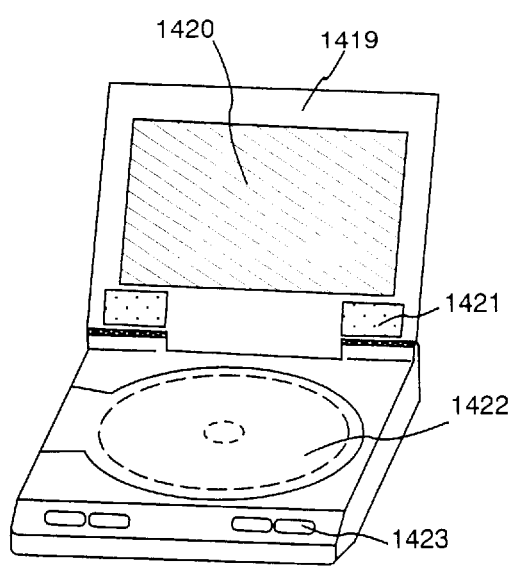

FIG. 14E illustrates a player using a recording medium (hereinafter referred to as recording medium) recording programs and including a main body 1419, a display unit 1420, a speaker unit 1421, a recording medium 1422, operation switches 1423 and the like. The player uses DVD (digital versatile disc), CD, etc. as a recording medium, and makes it possible to listen to music, watch movies, play games and carry out communication through an internet. The invention can be applied to the display unit 1420 and to any other signal control circuit.

Figure 14F:
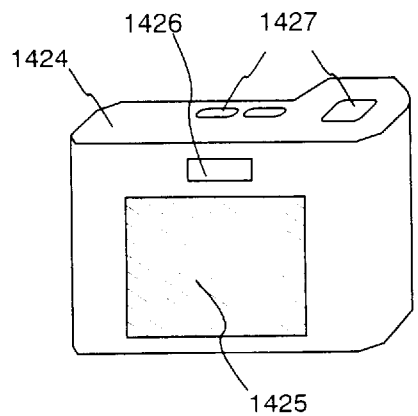

FIG. 14F illustrates a digital camera which includes a main body 1424, a display unit 1425, an eyepiece 1426, operation switches 1427 and a picture unit (not shown). The invention can be applied to the display unit 1425 and to any other signal control circuit.

Figure 15A:
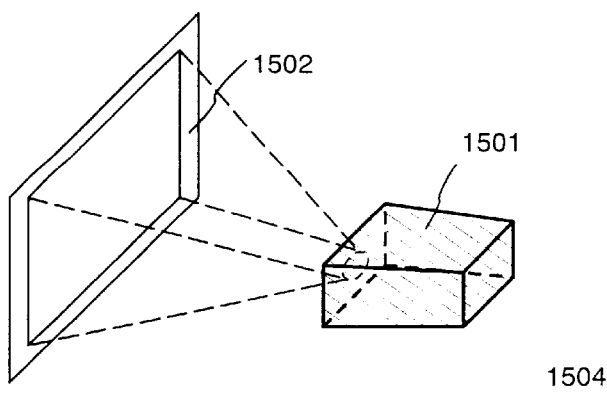
FIGS. 15A to 15D are views illustrating examples of electronic devices (embodiment 5)

FIG. 15A is a front-type projector which includes a projector unit 1501, a screen 1502 and the like. The invention can be applied to a liquid crystal display device 1514 constituting a portion of the projector device 1501 and to any other signal control circuit.

Figure 15B:
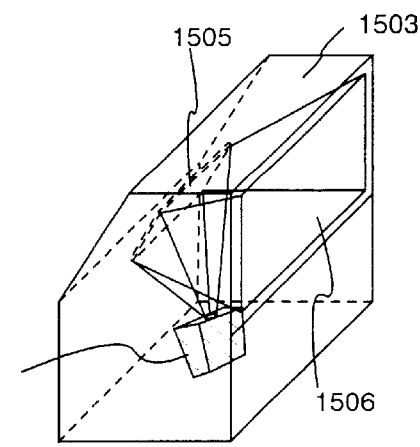

FIG. 15B is a rear-type projector which includes a main body 1503, a projector unit 1504, a mirror 1505, a screen 1506 and the like. The invention can be applied to a liquid crystal display device 1514 constituting a portion of the projector unit 1504 and to any other signal control circuit.

Figure 15C:
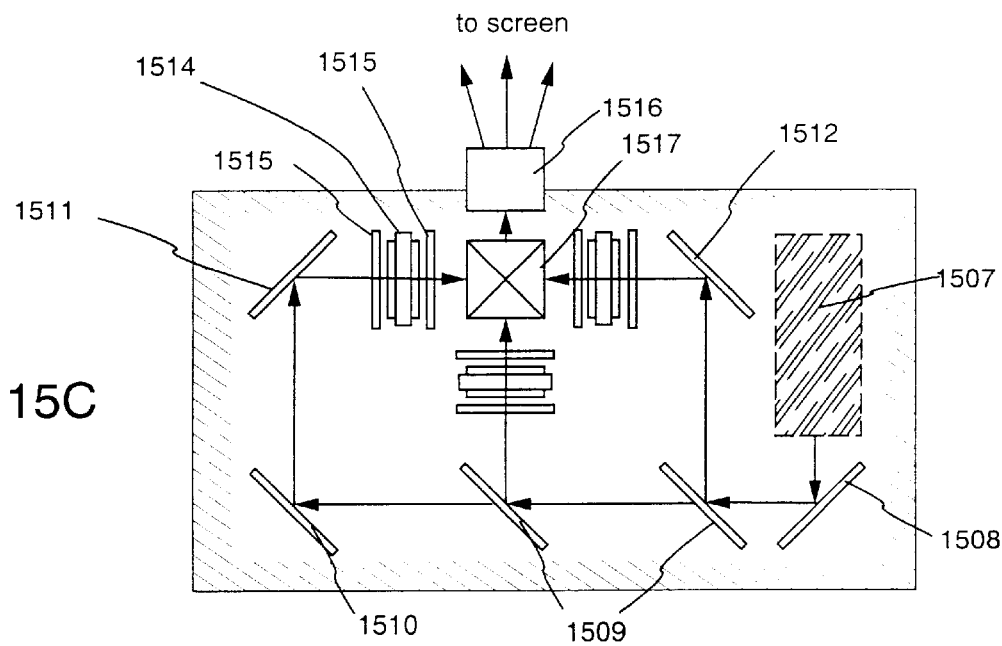

FIG. 15C is a view illustrating structures of the projector units 1501 and 1504 in FIGS. 15A and 15B. The projector units 1501 and 1504 are constituted by a light source optical system 1507, mirrors 1508, 1510 to 1512, dichroic mirrors 1509, a prism 1517, a liquid crystal display device 1514, a phase difference plate 1515, and a projection optical system 1516. The projection optical system 1516 is constituted by an optical system that includes a projection lens. This Embodiment deals with the structure of a three-plate type which, however, is not to limit the invention and may, for example, be a single-plate type. A person who implements the invention may suitably provide an optical system, such as an optical lens, a film having a polarizing function, a film for adjusting the phase difference or an IR film in the optical paths indicated by arrows in FIG. 15C.

Figure 15D:
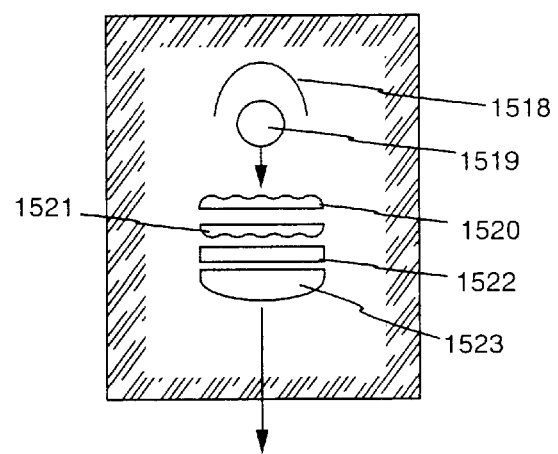

FIG. 15D is a view illustrating a structure of the light source optical system 1507 in FIG. 15C. In this Embodiment, the light source optical system 1507 is constituted by reflectors 15, 18, a source of light 1519, lens arrays 1520, 1521, a polarizer/conversion element 1522 and a focusing lens 1523. The light source optical system shown in FIG. 15D is only an example which in no way limits the invention. For example, a person who implements the invention may suitably provide an optical system, such as an optical lens, a film having a polarizing function, a film for adjusting the phase difference or an IR film in the optical paths of the source of light.

Here, the projector shown in FIG. 15 uses an electro-optical device of the transmission type, and the electro-optical device of the reflection type is not diagramed here.

Figure 16A:
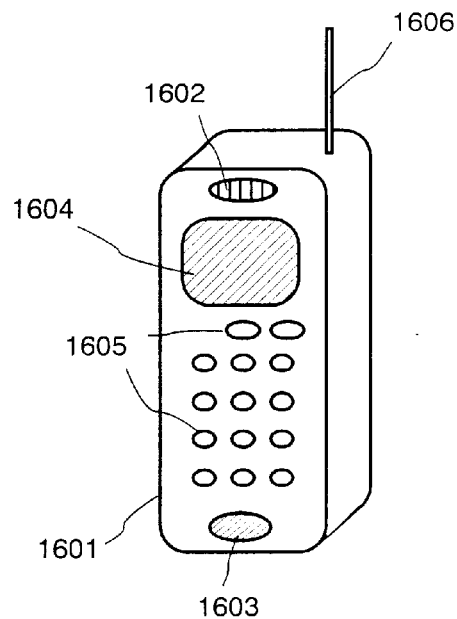
FIGS. 16A to 16C are views illustrating examples of electronic devices (embodiment 5)

FIG. 16A illustrates a cellular telephone which includes a main body 1601, a voice output unit 1602, a voice input unit 1603, a display unit 1604, an operation switch 1605, an antenna 1606 and the like. The invention can be applied to the voice output unit 1602, voice input unit 1603, display unit 1604 and any other signal control circuit.

Figure 16B:
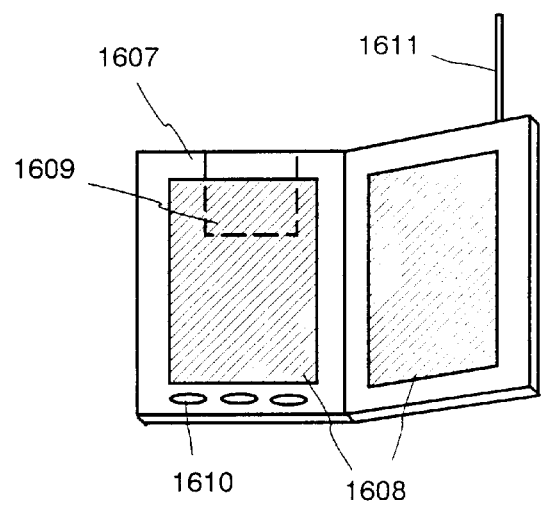

FIG. 16B illustrates a portable book (electronic dictionary) which includes a main body 1607, a display unit 1608, a storage medium 1609, operation switches 16010, an antenna 1611 and the like. The invention can be applied to display units 1608, 1609 and any other signal circuit.

Figure 16C:
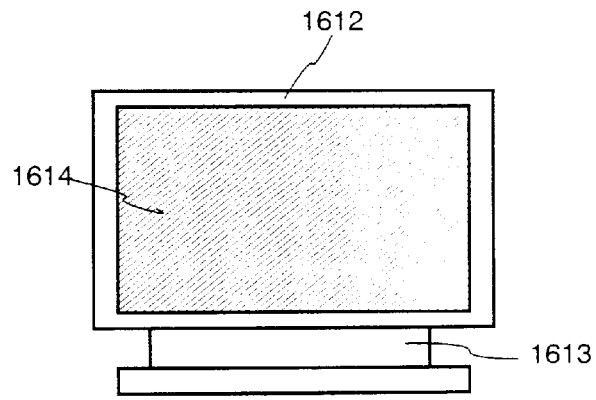

FIG. 16C illustrates a display which includes a main body 1612, a support plate 1613, a display unit 1614 and the like. The invention can be applied to the display unit 1614. The display of this invention is particularly advantageous when it is designed to have a large screen and when the diagonal is not smaller than 10 inches (particularly, not smaller than 30 inches).

As described above, the invention can be used over a very wide range and can be applied to electronic equipment of every field. Further, the electronic equipment of this embodiment can be realized by using any combination of constitutions of Embodiments 1 to 4.

According to this invention, the silicon oxynitride film is formed by the plasma CVD method by using SiH$_4$, N$_2$O and H$_2$ as starting material gases and varying the flow rate ratios of the starting material gases. Thus, there is formed a favorable base film in which the composition of N, O and H is continuously varied. When used as the base film, the film of the invention not only prevents the diffusion of impurities from the substrate owing to its blocking effect but also forms a favorable interface relative to the active layer to prevent deterioration in the TFT characteristics. Since the film is formed in the same chamber, the treatment time is shortened, the TFT characteristics are stabilized and the productivity is enhanced.

What is claimed is:

1. A method of producing a semiconductor device comprising the steps of:
    forming an insulating film comprising a silicon oxynitride film on a substrate; and
    forming a semiconductor film on said insulating film,
    wherein said insulating film comprises at least a first layer in contact with said substrate and a second layer in contact with said semiconductor film,
    wherein said first layer is formed from $SiH_4$, $N_2O$, and $H_2$, and
    wherein said second layer is formed from $SiH_4$ and $N_2O$.

2. A method according to claim 1 wherein said first layer and said second layer forming steps are performed in a same film-forming chamber of a plasma CVD apparatus.

3. A method according to claim 1 wherein a nitrogen concentration in said silicon oxynitride film decreases continuously toward an interface between said insulating film and said semiconductor film.

4. A method according to claim 1 wherein an oxygen concentration in said silicon oxynitride film increases continuously toward an interface between said insulating film and said semiconductor film.

5. A method of producing a semiconductor device comprising the steps of:
    forming an insulating film on a substrate; and
    forming a semiconductor film on said insulating film,
    wherein said insulating film comprises a silicon oxynitride film formed from $SiH_4$, $N_2O$, and $H_2$, and
    wherein said silicon oxynitride film is formed by decreasing a flow rate of said $H_2$ and increasing a flow rate of said $N_2O$ from a region in contact with said substrate to a region in contact with said semiconductor film.

6. A method according to claim 5 wherein a nitrogen concentration in said silicon oxynitride film decreases continuously toward an interface between said insulating film and said semiconductor film.

7. A method according to claim 5 wherein an oxygen concentration in said silicon oxynitride film increases continuously toward an interface between said insulating film and said semiconductor film.

8. A method of producing a semiconductor device comprising the steps of:
    forming an insulating film comprising a silicon oxynitride film on a substrate; and
    forming a semiconductor film on said insulating film,
    wherein said insulating film comprises at least a first layer in contact with said substrate and a second layer in contact with said semiconductor film,
    wherein said first layer is formed at a gas flow rate ratio of $Xh$ $(=H_2(SiH_4+N_2O))$ from 0.5 to 5, and a gas flow rate ratio of $Xg$ $(=N_2O/(SiH_4+N_2O))$ from 0.94 to 0.97, and
    wherein said second layer is formed at a gas flow rate ratio of $Xh$ $(=H_2/(SiH_4+N_2O))$ equal to 0, and a gas flow rate ratio of $Xg$ $(=N_2O/(SiH_4+N_2O))$ from 0.97 to 0.99.

9. A method according to claim 8 wherein said steps of forming said first layer and said second layer are performed in a same film-forming chamber of a plasma CVD apparatus.

10. A method according to claim 8 wherein a nitrogen concentration in said silicon oxynitride film decreases continuously toward an interface between said insulating film and said semiconductor film.

11. A method according to claim 8 wherein an oxygen concentration in said silicon oxynitride film increases continuously toward an interface between said insulating film and said semiconductor film.

12. A method of producing a semiconductor device comprising the steps of:
    forming an insulating film comprising a silicon oxynitride film on a substrate; and
    forming a semiconductor film on said insulating film,
    wherein said insulating film is formed by changing gas flow rate ratios of $Xh$ $(=H_2/(SiH_4+N_2O))$ from 0.5 to 5, and $Xg$ $(=N_2O/(SiH_4+N_2O))$ from 0.94 to 0.97 to $Xh$ $(=H_2/(SiH_4+N_2O))$ equal to 0, and $Xg$ $(=N_2O/(SiH_4+N_2O))$ from 0.97 to 0.99 from a region in contact with said substrate to a region in contact with said semiconductor film.

13. A method according to claim 12 wherein a nitrogen concentration in said silicon oxynitride film decreases continuously toward an interface between said insulating film and said semiconductor film.

14. A method according to claim 12 wherein an oxygen concentration in said silicon oxynitride film increases continuously toward an interface between said insulating film and said semiconductor film.

15. A method of producing a semiconductor device comprising the steps of:
    forming a first silicon oxynitride film in contact with a substrate, said first silicon oxynitride film having hydrogen concentration from 1.5 to 5 atomic %, nitrogen concentration from 2 to 10 atomic %, and oxygen concentration from 50 to 60 atomic %;
    forming a second silicon oxynitride film, said second silicon oxynitride film having hydrogen concentration from 0.1 to 2 atomic %, nitrogen concentration from 0.1 to 2 atomic %, and oxygen concentration from 60 to 65 atomic %; and
    forming a semiconductor film on said second silicon oxynitride film,
    wherein said forming steps are performed continuously in a same film-forming chamber.

16. A method according to claim 15 wherein a nitrogen concentration in said first and second silicon oxynitride films decreases continuously toward an interface between said second silicon oxynitride film and said semiconductor film.

17. A method according to claim 15 wherein an oxygen concentration in said first and second silicon oxynitride films increases continuously toward an interface between said second silicon oxynitride film and said semiconductor film.

18. A method of producing a semiconductor device comprising the steps of:
    forming an insulating film comprising a silicon oxynitride film on a substrate; and
    forming a semiconductor film on said insulating film,
    wherein a region of said silicon oxynitride film in contact with said substrate has hydrogen concentration from 1.5 to 5 atomic %, nitrogen concentration from 2 to 10 atomic %, and oxygen concentration from 50 to 60 atomic %,
    wherein a region of said silicon oxynitride film in contact with said semiconductor film has hydrogen concentration from 0.1 to 2 atomic %, nitrogen concentration from 0.1 to 2 atomic %, and oxygen concentration from 60 to 65 atomic %, wherein said silicon oxynitride film continuously changes a composition thereof, and wherein said forming steps are performed in a same film-forming chamber.

19. A method according to claim 18 wherein a nitrogen concentration in said silicon oxynitride film decreases continuously toward an interface between said insulating film and said semiconductor film.

20. A method according to claim 18 wherein an oxygen concentration in said silicon oxynitride film increases continuously toward an interface between said insulating film and said semiconductor film.

21. A method of producing a semiconductor device comprising the steps of:

forming a first insulating film comprising a silicon oxynitride film in contact with a substrate, said silicon oxynitride film having an oxygen composition ratio to silicon from 1.4 to 1.8, a nitrogen composition ratio to silicon from 0.05 to 0.5;

forming a second insulating film comprising a silicon oxynitride film on said first insulating film, said silicon oxynitride film having an oxygen composition ratio to silicon from 1.7 to 2, a nitrogen composition ratio to silicon from 0.02 to 0.06; and forming a semiconductor film on said second insulating film, wherein said forming steps are performed continuously in a same film-forming chamber.

22. A method according to claim 21 wherein a nitrogen concentration in said silicon oxynitride film decreases continuously toward an interface between said second insulating film and said semiconductor film.

23. A method according to claim 21 wherein an oxygen concentration in said silicon oxynitride film increases continuously toward an interface between said second insulating film and said semiconductor film.

24. A method of producing a semiconductor device comprising the steps of:

forming an insulating film comprising a silicon oxynitride film on a substrate; and forming a semiconductor film on said insulating film, wherein a region of said silicon oxynitride film in contact with said substrate has an oxygen composition ratio to silicon from 1.4 to 1.8, and a nitrogen composition ratio to silicon from 0.05 to 0.5, wherein a region of said silicon oxynitride film in contact with said semiconductor film has an oxygen composition ratio to silicon from 1.7 to 2, and a nitrogen composition ratio to silicon from 0.02 to 0.06, wherein said silicon oxynitride film continuously changes a composition thereof, and wherein said forming steps are performed in a same film-forming chamber.

25. A method according to claim 24 wherein a nitrogen concentration in said silicon oxynitride film decreases continuously toward an interface between said insulating film and said semiconductor film.

26. A method according to claim 24 wherein an oxygen concentration in said silicon oxynitride film increases continuously toward an interface between said insulating film and said semiconductor film.

27. A method of producing a semiconductor device comprising the steps of:

forming a first silicon oxynitride film in contact with a substrate, said first silicon oxynitride film having hydrogen concentration from 1.5 to 5 atomic %, nitrogen concentration from 2 to 10 atomic %, and oxygen concentration from 50 to 60 atomic %;

forming a second silicon oxynitride film, said second silicon oxynitride film having hydrogen concentration from 0.1 to 2 atomic %, nitrogen concentration from 0.1 to 2 atomic %, and oxygen concentration from 60 to 65 atomic %; and forming a semiconductor film on said second silicon oxynitride film.

28. A method according to claim 27 wherein a nitrogen concentration in said first and second silicon oxynitride films decreases continuously toward an interface between said second silicon oxynitride film and said semiconductor film.

29. A method according to claim 27 wherein an oxygen concentration in said first and second silicon oxynitride films increases continuously toward an interface between said second silicon oxynitride film and said semiconductor film.

30. A method of producing a semiconductor device comprising the steps of:

forming a first insulating film comprising a silicon oxynitride film in contact with a substrate, said silicon oxynitride film having an oxygen composition ratio to silicon from 1.4 to 1.8, a nitrogen composition ratio to silicon from 0.05 to 0.5;

forming a second insulating film comprising a silicon oxynitride film on said first insulating film, said silicon oxynitride film having an oxygen composition ratio to silicon from 1.7 to 2, a nitrogen composition ratio to silicon from 0.02 to 0.06; and forming a semiconductor film on said second insulating film.

31. A method according to claim 30 wherein a nitrogen concentration in said silicon oxynitride film decreases continuously toward an interface between said second insulating film and said semiconductor film.

32. A method according to claim 30 wherein an oxygen concentration in said silicon oxynitride film increases continuously toward an interface between said second insulating film and said semiconductor film.

* * * * *